(12) United States Patent
Wikner

(10) Patent No.: US 8,456,347 B2
(45) Date of Patent: Jun. 4, 2013

(54) ANALOG-TO-DIGITAL CONVERTER

(75) Inventor: Jacob Wikner, Linkoping (SE)

(73) Assignee: CSR Technology Inc., Sunnyvale, CA (US)

(*) Notice: Subject to any disclaimer, the term of this patent is extended or adjusted under 35 U.S.C. 154(b) by 90 days.

(21) Appl. No.: 13/122,824

(22) PCT Filed: Oct. 9, 2009

(86) PCT No.: PCT/SE2009/051138
§ 371 (c)(1),
(2), (4) Date: May 20, 2011

(87) PCT Pub. No.: WO2010/042051
PCT Pub. Date: Apr. 15, 2010

(65) Prior Publication Data
US 2011/0248876 A1    Oct. 13, 2011

Related U.S. Application Data

(60) Provisional application No. 61/105,863, filed on Oct. 16, 2008.

(30) Foreign Application Priority Data

Oct. 10, 2008 (SE) .................................. 0802170

(51) Int. Cl.
*H03M 1/36* (2006.01)
(52) U.S. Cl.
USPC ........... 341/159; 341/118; 341/120; 341/155; 341/163; 341/154
(58) Field of Classification Search
USPC .................. 341/118, 120, 155, 159, 154, 163
See application file for complete search history.

(56) References Cited

U.S. PATENT DOCUMENTS

| 4,831,381 A | 5/1989 | Hester |
| 5,585,796 A * | 12/1996 | Svensson et al. ............. 341/155 |

(Continued)

FOREIGN PATENT DOCUMENTS

WO    9315556 A1    8/1993

OTHER PUBLICATIONS

N. Hamdy et al., "A High-Speed A/D Converter Architecture for High-Resolution Applications", IEEE 39th Midwest Symposium on Circuits and Systems, Aug. 18-21, 1996, vol. 1, p. 213-216, Chapter III, Figures 1, 2.

(Continued)

*Primary Examiner* — Linh Nguyen
(74) *Attorney, Agent, or Firm* — Lando & Anastasi, LLP

(57) ABSTRACT

An analog-to-digital converter including a voltage generation unit and a plurality of sub ADCs, each including a selection unit for selecting a voltage generated by the voltage generation unit based on a number and forwarding the selected voltage to a comparator arrangement. The selection unit includes first and second switch layers. The first switch layer includes a plurality of switch groups, each including a plurality of switch devices, each connected to a unique output terminal of the voltage generation unit with a first terminal and to a common node of the switch group with a second terminal. The second switch layer includes a switch device between the common node of each switch group and the first output terminal of the selection unit and a switch device between the common node and the second output terminal of the selection unit. A control unit generates control signals for the switch devices.

19 Claims, 8 Drawing Sheets

U.S. PATENT DOCUMENTS

| | | | |
|---|---|---|---|
| 6,392,575 B1* | 5/2002 | Eklund | 341/141 |
| 6,424,284 B1* | 7/2002 | Lopata et al. | 341/163 |
| 6,518,907 B2* | 2/2003 | Tsai | 341/155 |
| 6,583,745 B2* | 6/2003 | Sakakibara et al. | 341/155 |
| 6,914,547 B1* | 7/2005 | Swaroop et al. | 341/144 |
| 7,109,904 B2* | 9/2006 | Fotouhi | 341/144 |
| 7,126,511 B2* | 10/2006 | Draxelmayr et al. | 341/136 |
| 7,868,809 B2* | 1/2011 | Iadanza et al. | 341/154 |
| 7,952,509 B2* | 5/2011 | Aruga et al. | 341/163 |
| 7,995,022 B2* | 8/2011 | Yoshioka et al. | 345/89 |
| 2005/0024251 A1* | 2/2005 | Harada et al. | 341/163 |
| 2006/0132343 A1* | 6/2006 | Fotouhi | 341/144 |
| 2011/0241912 A1* | 10/2011 | Doris et al. | 341/110 |

OTHER PUBLICATIONS

International Search Report and Written Opinion from corresponding International Application No. PCT/SE2009/051138 dated Jan. 21, 2010.

* cited by examiner

| Bit of $X_{SA}$ | | | | Output bit of 4-to-16 encoder | | | | | | | | | | | | | | | |
|---|---|---|---|---|---|---|---|---|---|---|---|---|---|---|---|---|---|---|---|
| 3 | 2 | 1 | 0 | 15 | 14 | 13 | 12 | 11 | 10 | 9 | 8 | 7 | 6 | 5 | 4 | 3 | 2 | 1 | 0 |
| 0 | 0 | 0 | 0 | 0 | 0 | 0 | 0 | 0 | 0 | 0 | 0 | 0 | 0 | 0 | 0 | 0 | 0 | 0 | 1 |
| 0 | 0 | 0 | 1 | 0 | 0 | 0 | 0 | 0 | 0 | 0 | 0 | 0 | 0 | 0 | 0 | 0 | 0 | 1 | 0 |
| 0 | 0 | 1 | 0 | 0 | 0 | 0 | 0 | 0 | 0 | 0 | 0 | 0 | 0 | 0 | 0 | 0 | 1 | 0 | 0 |
| 0 | 0 | 1 | 1 | 0 | 0 | 0 | 0 | 0 | 0 | 0 | 0 | 0 | 0 | 0 | 0 | 1 | 0 | 0 | 0 |
| 0 | 1 | 0 | 0 | 0 | 0 | 0 | 0 | 0 | 0 | 0 | 0 | 0 | 0 | 0 | 1 | 0 | 0 | 0 | 0 |
| 0 | 1 | 0 | 1 | 0 | 0 | 0 | 0 | 0 | 0 | 0 | 0 | 0 | 0 | 1 | 0 | 0 | 0 | 0 | 0 |
| 0 | 1 | 1 | 0 | 0 | 0 | 0 | 0 | 0 | 0 | 0 | 0 | 0 | 1 | 0 | 0 | 0 | 0 | 0 | 0 |
| 0 | 1 | 1 | 1 | 0 | 0 | 0 | 0 | 0 | 0 | 0 | 0 | 1 | 0 | 0 | 0 | 0 | 0 | 0 | 0 |
| 1 | 0 | 0 | 0 | 0 | 0 | 0 | 0 | 0 | 0 | 0 | 1 | 0 | 0 | 0 | 0 | 0 | 0 | 0 | 0 |
| 1 | 0 | 0 | 1 | 0 | 0 | 0 | 0 | 0 | 0 | 1 | 0 | 0 | 0 | 0 | 0 | 0 | 0 | 0 | 0 |
| 1 | 0 | 1 | 0 | 0 | 0 | 0 | 0 | 0 | 1 | 0 | 0 | 0 | 0 | 0 | 0 | 0 | 0 | 0 | 0 |
| 1 | 0 | 1 | 1 | 0 | 0 | 0 | 0 | 1 | 0 | 0 | 0 | 0 | 0 | 0 | 0 | 0 | 0 | 0 | 0 |
| 1 | 1 | 0 | 0 | 0 | 0 | 0 | 1 | 0 | 0 | 0 | 0 | 0 | 0 | 0 | 0 | 0 | 0 | 0 | 0 |
| 1 | 1 | 0 | 1 | 0 | 0 | 1 | 0 | 0 | 0 | 0 | 0 | 0 | 0 | 0 | 0 | 0 | 0 | 0 | 0 |
| 1 | 1 | 1 | 0 | 0 | 1 | 0 | 0 | 0 | 0 | 0 | 0 | 0 | 0 | 0 | 0 | 0 | 0 | 0 | 0 |
| 1 | 1 | 1 | 1 | 1 | 0 | 0 | 0 | 0 | 0 | 0 | 0 | 0 | 0 | 0 | 0 | 0 | 0 | 0 | 0 |

170

| Bit of $X_{SA}$ | | Output of 2-to-4 encoder | | | |
|---|---|---|---|---|---|
| 3 | 2 | 3 | 2 | 1 | 0 |
| 0 | 0 | 0 | 0 | 0 | 1 |
| 0 | 1 | 0 | 0 | 1 | 0 |
| 1 | 0 | 0 | 1 | 0 | 0 |
| 1 | 1 | 1 | 0 | 0 | 0 |

ANALOG-TO-DIGITAL CONVERTER

TECHNICAL FIELD

The present invention relates to an analog-to-digital converter. More particularly, the present invention relates to a parallel successive-approximation analog-to-digital converter.

BACKGROUND

An analog-to-digital converter (ADC) is used for converting an analog input signal to a digital output signal. Typically, the ADC may be arranged to compare the analog input signal, or a signal derived therefrom, with one or more reference levels for generating the digital output signal.

In a successive-approximation ADC (SA-ADC), each sample of the analog input signal is compared, by means of a binary-search algorithm, with a plurality of reference levels. The bits of the digital output signal are determined in the order of significance, starting with the most significant bit (MSB) and ending with the least significant bit (LSB). For an N-bit SA-ADC, N comparisons are made for each sample in order to determine the N bits of the corresponding sample of the digital output signal.

In a parallel successive-approximation ADC (PSA-ADC), which is e.g. described in U.S. Pat. No. 5,585,796, a plurality of SA-ADCs are arranged in parallel to operate in a time-interleaved manner. Thereby an overall sampling rate is obtained, which can be considerably higher than the sampling rate of each individual SA-ADC in the plurality of SA-ADCs. Furthermore, all of the plurality of SA-ADCs uses a common reference-voltage generator, e.g. in the form of a resistor string. Thereby, the mutual matching between the individual SA-ADCs, e.g. in terms of gain and offset errors, is improved compared with if each individual SA-ADC would have its own dedicated reference-voltage generator.

As time goes by, new applications emerge that may set harder requirements on ADCs, e.g. in terms of sampling rate and/or resolution. As a nonlimiting example, some video applications, wherein an ADC e.g. may be used for sampling of RGB (Red Green Blue) signals, may require a resolution of 8-10 bits, or even higher, and a sampling rate of 270 MHz, or even higher. Such requirements may be difficult to reach.

Furthermore, newer fabrication technologies, and also a desire to reduce power dissipation, tend to dictate use of a reduced supply voltage. A reduced supply voltage may in turn cause a reduced noise margin, which e.g. may make it difficult to improve the ADC resolution.

In view of the above, there is a need for an improved PSA-ADC circuitry.

SUMMARY

Accordingly, an object of the present invention is to provide improved PSA-ADC circuitry.

According to a first aspect, there is provided a PSA-ADC for generating a digital output signal based on an analog input signal. The PSA-ADC comprises a reference-voltage generation unit having a plurality of output terminals. The reference-voltage generation unit is arranged to generate a unique reference voltage on each of its output terminals. Each reference voltage and corresponding output terminal correspond to a unique digital number in a range $[X_{min}, X_{max}]$. Furthermore, the PSA-ADC comprises a plurality of sub analog-to-digital converters (sub ADCs) arranged for successive-approximation operation in a time-interleaved manner. Each of the plurality of sub ADCs comprises a reference-voltage selection unit operatively connected to the reference-voltage generation unit for selecting a reference voltage generated by the reference-voltage generation unit based on a digital number $X_{SA}$ stored in a successive-approximation register (SAR) of the sub ADC and forwarding the selected reference voltage to a comparator arrangement of the sub ADC. The reference-voltage selection unit has a first and a second output terminal operatively connected to the comparator arrangement of the sub ADC. Furthermore, the reference-voltage selection unit comprises a first switch layer comprising a plurality of switch groups, wherein each switch group comprises a plurality of switch devices. Each switch device in a switch group is operatively connected to a unique one of the output terminals of the reference-voltage generation unit with a first terminal of the switch device and to a common node of the switch group with a second terminal of the switch device. For each X in the range $[X_{min}, X_{max}]$, the switch devices connected to the output terminals of the reference voltage generation unit that correspond to X and $X_{min}+X_{max}-X$ belong to different switch groups. Moreover, the reference-voltage selection unit comprises a second switch layer comprising, for each switch group in the first switch layer, a switch device operatively connected between the common node of the switch group and the first output terminal of the reference-voltage selection unit and a switch device operatively connected between the common node of the switch group and the second output terminal of the reference-voltage selection unit.

In addition, each sub ADC comprises a control unit arranged to generate control signals for the switch devices in the reference-voltage selection unit of the sub ADC based on the digital number $X_{SA}$ in the SAR of the sub ADC for closing a first selected switch device in the first switch layer that is connected to the output terminal of the reference-voltage generation unit that corresponds to $X_{SA}$ and the switch device in the second switch layer that is connected between the common node of the switch group to which the first selected switch device belongs and the first output terminal. Furthermore, the control unit is arranged to generate control signals for the switch devices in the reference-voltage selection unit of the sub ADC based on the digital number $X_{SA}$ in the SAR of the sub ADC for closing a second selected switch device in the first switch layer that is connected to the output terminal of the reference-voltage generation unit that corresponds to $X_{max}+X_{min}-X_{SA}$ and the switch device in the second switch layer that is connected between the common node of the switch group to which the second selected switch device belongs and the second output terminal.

The number of switch groups in the first switch layer of each reference-voltage selection unit may e.g. be an integer power of two according to some embodiments. Furthermore, the number of switch groups in the first switch layer of each reference-voltage selection unit may be at least four according to some embodiments.

The reference-voltage selection unit may comprise one or more intermediate switch layers of switch devices operatively connected between the first switch layer and the second switch layer for selectably connecting switch devices in the first switch layer to the corresponding common node. Each switch device in an intermediate switch layer may, according to some embodiments, be connected with an input terminal of the switch device to between two and four switch devices in a preceding switch layer. According to some embodiments, each switch device in said intermediate switch layer may be connected with an input terminal of the switch device to four switch devices in said preceding switch layer. Furthermore, according to some embodiments, each switch device in each intermediate switch layer is connected with an input terminal of the switch device to between two and four switch devices in a preceding switch layer. Moreover, according to some embodiments, each switch device in each intermediate switch layer is connected with an input terminal of the switch device to four switch devices in said preceding switch layer.

The reference-voltage generation unit may e.g. comprise a resistor string.

The SAR may comprise N bits. Said reference-voltage generation unit may be a coarse reference-voltage generation unit arranged to generate reference voltages for determining K most significant bits (MSBs) of the digital output signal. Furthermore, said reference voltage selection unit may be a coarse reference voltage selection unit arranged to select and forward reference voltages for determining the K MSBs of the digital output signal. For this case, the digital number $X_{SA}$ may be determined by the K MSBs of the SAR. In addition, the PSA-ADC may comprise a fine reference-voltage generation unit for determining the N-K least significant bits, LSBs, of the digital output signal. Furthermore, each sub ADC may comprise a fine reference-voltage selection unit for determining the N-K LSBs of the digital output signal.

The fine reference-voltage generation unit may have a plurality of output terminals and be arranged to generate a unique reference voltage on each of its output terminals. Each reference voltage and corresponding output terminal may correspond to a unique digital number in the range $[X_{min,LSB}, X_{max,LSB}]$. The fine reference-voltage selection unit may have a first and a second output terminal operatively connected to the comparator arrangement of the sub ADC. Furthermore, the fine reference-voltage selection unit may and comprise a first switch layer comprising a plurality of switch groups. Each switch group may comprise a plurality of switch devices. Each switch device in a switch group may be operatively connected to a unique one of the output terminals of the fine reference-voltage generation unit with a first terminal of the switch device and to a common node of the switch group with a second terminal of the switch device. For each X in the range $[X_{min,LSB}, X_{max,LSB}]$, the switch devices connected to the output terminals of the fine reference voltage unit that correspond to X and $X_{max,LSB}+X_{min,LSB}-X$ may belong to different switch groups. Moreover, the fine reference-voltage selection unit may comprise a second switch layer comprising, for each switch group in the first switch layer, a switch device operatively connected between the common node of the switch group and the first output terminal of the fine reference-voltage selection unit and a switch device operatively connected between the common node of the switch group and the second output terminal of the fine reference-voltage selection unit. Each sub ADC may comprise a further control unit arranged to generate control signals for the switch devices in the fine reference-voltage selection unit of the sub ADC based on a digital number $X_{SA,LSB}$ determined by the N-K LSBs of the SAR of the sub ADC for closing a first selected switch device in the first switch layer that is connected to the output terminal of the fine reference-voltage generation unit that corresponds to $X_{SA,LSB}$ and the switch device in the second switch layer that is connected between the common node of the switch group to which the first selected switch device belongs and the first output terminal of the fine reference-voltage selection unit. Furthermore, the further control unit may be arranged to generate control signals for the switch devices in the fine reference-voltage selection unit of the sub ADC based on the digital number $X_{SA,LSB}$ for closing a second selected switch device in the first switch layer that is connected to the output terminal of the fine reference-voltage generation unit that corresponds to $X_{max,LSB}+X_{min,LSB}-X_{SA,LSB}$, and the switch device in the second switch layer that is connected between the common node of the switch group to which the second selected switch device belongs and the second output terminal of the fine reference-voltage selection unit.

The number of switch groups in the first switch layer of each fine reference-voltage selection unit may be an integer power of two. According to some embodiments, the number of switch groups in the first switch layer of each fine reference-voltage selection unit may be at least four. The fine reference-voltage generation unit may comprise a resistor string.

It is an advantage of embodiments of the PSA-ADC that the total loading, from all sub ADCs, of the reference-voltage generation unit is symmetrical. Thereby, reference-voltage fluctuations and nonlinearity errors may be reduced.

According to a second aspect, an integrated circuit comprises a PSA-ADC according to the first aspect.

According to a third aspect, an electronic apparatus comprises a PSA-ADC according to any of the first aspect. The electronic apparatus may e.g. be, but is not limited to, a television set, a liquid-crystal display, a computer monitor, a digital camera, a projector, or a radio receiver.

It should be emphasized that the term "comprises/comprising" when used in this specification is taken to specify the presence of stated features, integers, steps, or components, but does not preclude the presence or addition of one or more other features, integers, steps, components, or groups thereof.

BRIEF DESCRIPTION OF THE DRAWINGS

Further objects, features and advantages of the invention will appear from the following detailed description of the invention, reference being made to the accompanying drawings, in which:

FIG. 4b shows truth tables for components in the embodiment of the control unit in FIG. 4a;

DETAILED DESCRIPTION

Figure 1:
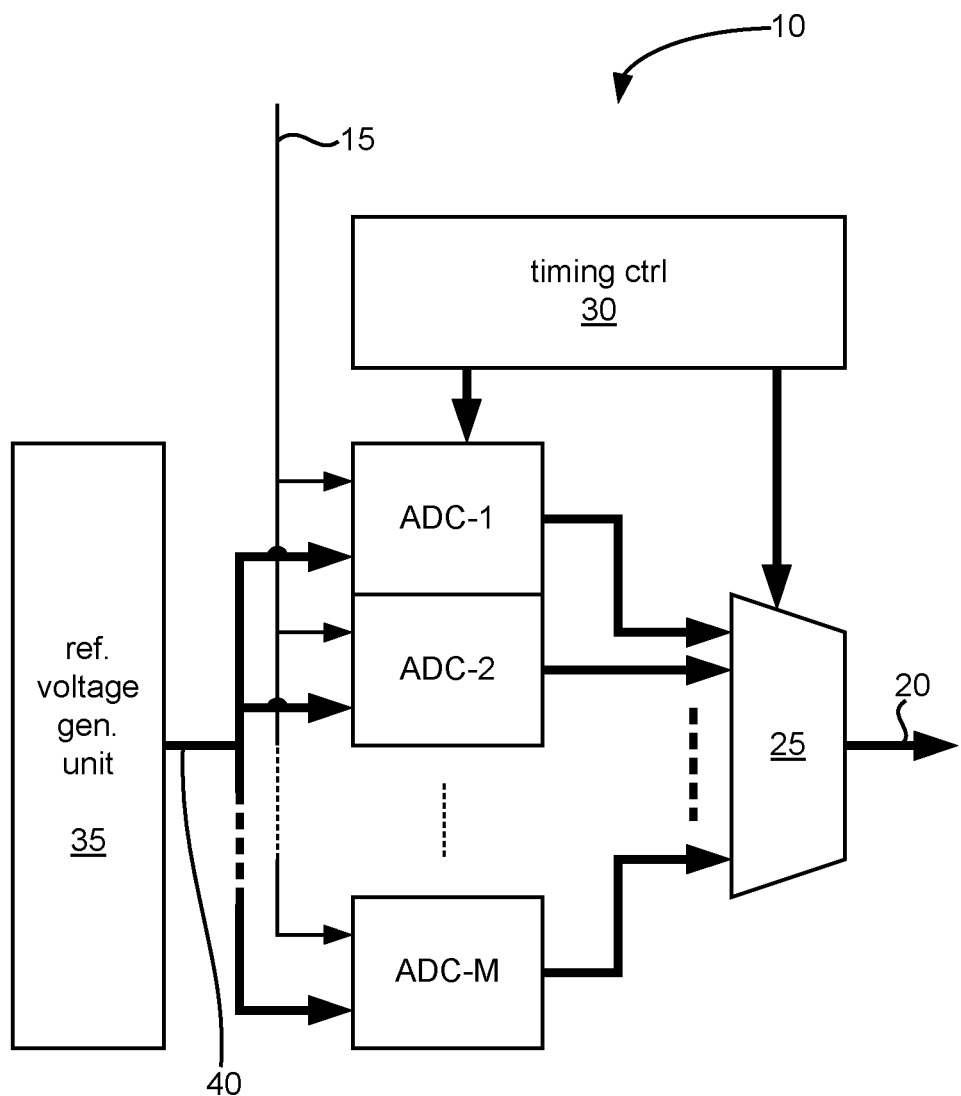
FIG. 1 is a block diagram of a PSA-ADC according to an embodiment.

FIG. 1 is a block diagram of a parallel successive-approximation analog-to-digital converter (PSA-ADC) 10 according to an embodiment. The PSA-ADC 10 has an analog input 15 for receiving an analog input signal of the PSA-ADC. In FIG. 1, the analog input 15 is shown as a single terminal. However, according to some embodiments, the analog input 15 of the PSA-ADC may be differential and comprise a positive and a negative input terminal. Furthermore, the PSA-ADC 10 has a digital output port 20 for outputting a digital output signal of the PSA-ADC 10.

The PSA-ADC 10 comprises a plurality of sub analog-to-digital converters (ADCs) ADC-1, ..., ADC-M arranged to operate in a time-interleaved manner. Each of the plurality of sub ADCs ADC-1, ..., ADC-M are arranged to operate at a common first sampling frequency. However, the individual sampling-clock signals for controlling the individual sub ADCs ADC-1, ..., ADC-M are mutually displaced in time. Thereby, the effective sampling rate of the PSA ADC is higher than the first sampling frequency. For the example embodiment illustrated in FIG. 1, wherein the number of sub ADCs ADC-1, ..., ADC-M is M, the effective sampling rate of the PSA-ADC 10 is M times the first sampling frequency.

Furthermore, the PSA-ADC 10 comprises a multiplexer unit 25 arranged to select the digital output word from one of the sub ADCs ADC-1, ..., ADC-M and forward the selected digital output word to the digital output port 20 of the PSA-ADC 10 based on a control signal from a timing-control unit 30 comprised in the PSA-ADC 10. The timing-control unit 30 may also be arranged to provide sampling-clock signals and other timing signals to the sub ADCs ADC-1, ..., ADC-M, as indicated in FIG. 1.

The basic principles of time-interleaved analog-to-digital (A/D) conversion is well known in the art and will not be described in further detail in this specification.

Figure 2:
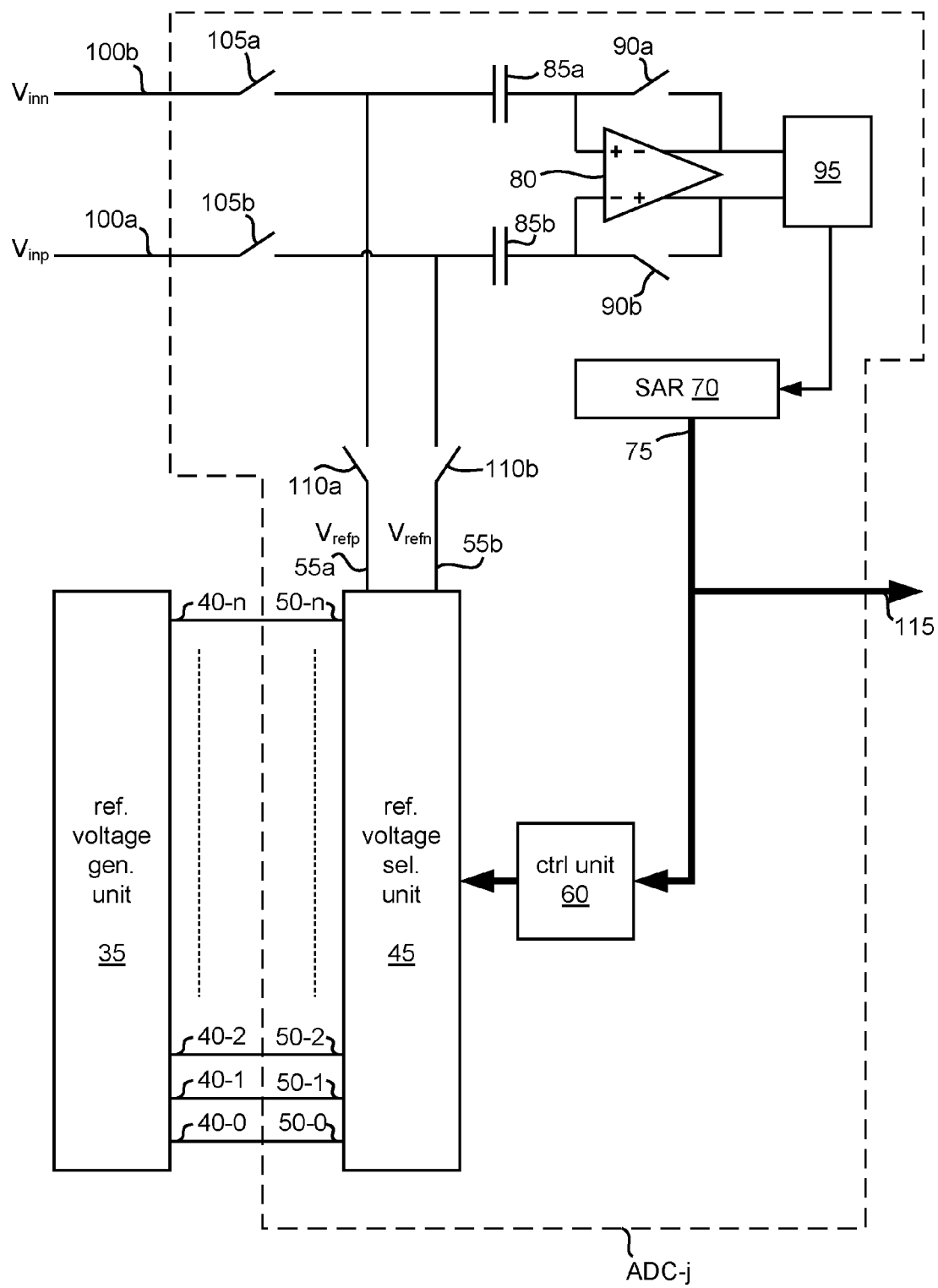
FIG. 2 is a circuit diagram of a sub ADC and a reference-voltage generation unit according to an embodiment.
Figure 3:
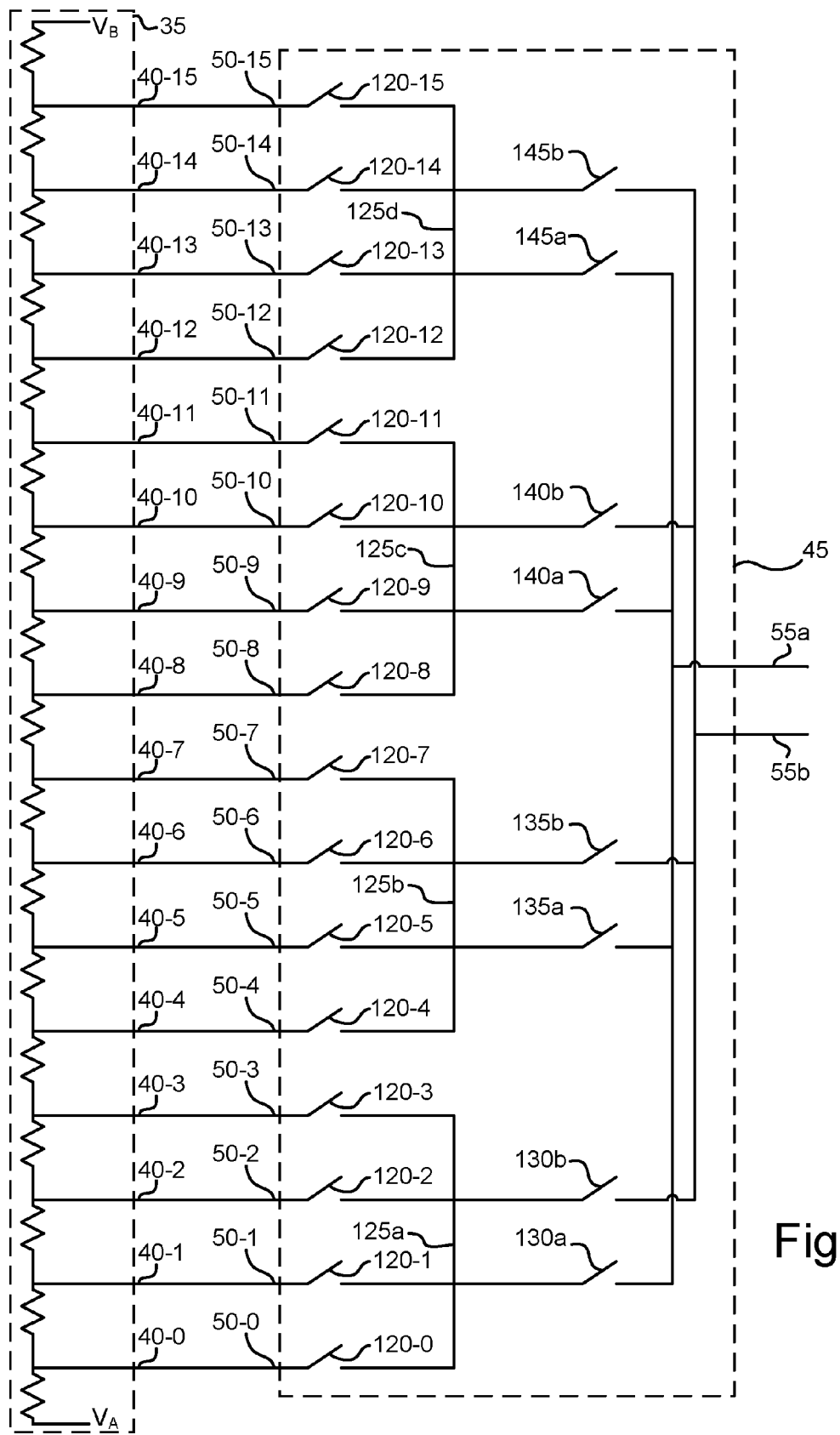
FIG. 3 is a circuit diagram of a reference-voltage selection unit and a reference-voltage generation unit according to an embodiment.

Moreover, the PSA-ADC 10 comprises a reference-voltage generation unit 35. The reference-voltage generation unit 35 has an output port 40 comprising a plurality of output terminals 40-0, ..., 40-n (FIGS. 2-3). The reference-voltage generation unit 35 is arranged to generate a unique reference voltage on each of its output terminals 40-0, ..., 40-n. Each one of said reference voltages, and the corresponding one of the output terminals 40-0, ..., 40-n, correspond to a unique digital number X in a range [$X_{min}$, $X_{max}$]. For example, according to some embodiments, the reference-voltage generation unit 35 may be designed to, for each X in [$X_{min}$, $X_{max}$], output the corresponding reference voltage as a monotone function V(X) of the digital number X. The monotone function V(X) may e.g. be equal or approximately equal to a straight line cX+m, where c and m are constants.

The reference-voltage generation unit 35 is common to all the sub ADCs ADC-1, ..., ADC-M, whereby a relatively good mutual matching between the sub ADCs ADC-1, ..., ADC-M is facilitated.

Each of the sub ADCs ADC-1, ..., ADC-M of the PSA-ADC 10 is arranged to perform successive-approximation (SA) A/D conversion. FIG. 2 is a simplified circuit diagram of an embodiment of a single sub ADC ADC-j. All of the sub ADCs ADC-1, ..., ADC-M may e.g. be identical in constitution to the sub ADC ADC-j. In addition to the sub ADC ADC-j, the reference-voltage generation unit 35 is also shown in FIG. 2.

According to the embodiment, each of the plurality of sub ADCs ADC-1, ..., ADC-M comprises a reference-voltage selection unit 45 operatively connected to the reference-voltage generation unit 35. The reference-voltage selection unit 45 has a plurality of input terminals 50-0, ..., 50-n. Each of the input terminals 50-0, ..., 50-n is operatively connected to a unique one of the output terminals 40-0, ..., 40-n of the reference-voltage generation unit 35. In FIG. 2, the terminal 50-0 is operatively connected to the terminal 40-0, the terminal 50-1 is operatively connected to the terminal 40-1, etc.

Furthermore, the reference-voltage selection unit has a positive output terminal 55a for outputting a reference voltage $V_{refp}$ and a negative output terminal 55b for outputting a reference voltage $V_{refn}$. According to embodiments, the reference-voltage selection unit comprises switch devices for selecting and forwarding one of the reference voltages generated by the reference voltage generation unit 35 to the positive output terminal 55a as the reference voltage $V_{refp}$ and another one of the reference voltages generated by the reference voltage generation unit 35 to the negative output terminal 55b as the reference voltage $V_{refn}$.

According to embodiments, switch devices referred to in this specification may e.g. comprise transistors, such as but not limited to MOS transistors, arranged to operate as switches. According to some embodiments, one or more of the switch devices may comprise an NMOS transistor. According to some embodiments, one or more of the switch devices may comprise a PMOS transistor. According to some embodiments, one or more of the switch devices may be implemented as a transmission gate, comprising an NMOS transistor connected in parallel with a PMOS transistor.

According to the embodiment illustrated in FIG. 2, the sub ADC ADC-j comprises a control unit 60 and a successive-approximation register (SAR) 70. An output port 75 of the SAR 70 is operatively connected to the control unit 60. The control unit 60 is arranged to generate control signals to the switch devices in the reference-voltage selection unit 45 based on the content of the SAR 70.

According to an embodiment, the PSA-ADC 10 is an N-bit ADC. The SAR 70 in each sub ADC ADC-1, ..., ADC-M therefore has N bit positions. In the following, $X_{SA}$ is used to denote the digital number represented by the N bits in the SAR. The control unit 60 is, according to the embodiment, arranged to generate control signals to the switch devices in the reference-voltage selection unit 45 such that the reference voltage from the reference-voltage generation unit 35 that corresponds to $X_{SA}$ is forwarded to the positive output terminal 55a of the reference-voltage selection unit 45 as the reference voltage $V_{refp}$. Furthermore, the control unit 60 is arranged to generate control signals to the switch devices in the reference-voltage selection unit 45 such that the reference voltage from the reference-voltage generation unit 35 that corresponds to $X_{max}+X_{min}-X_{SA}$ is forwarded to the negative output terminal 55b of the reference-voltage selection unit 45 as the reference voltage $V_{refn}$. The reference-voltage generation unit 35, the reference-voltage selection unit 45, and the control unit 60 together form a digital-to-analog converter (DAC).

The sub ADC ADC-j may comprise a comparator arrangement for comparing the analog input voltage with reference voltages. In the embodiment illustrated in FIG. 2, the comparator arrangement comprises a fully differential comparator 80, sampling capacitors 85a-b, switch devices 90a-b, and a decision unit 95. The decision unit 95 is arranged to generate a logic output signal with distinct logic levels based on the output signal from the comparator 80. For example, the decision unit 95 may comprise a latch circuit for that purpose. The comparator arrangement illustrated in FIG. 2 is only an example. Other known or future types of comparator arrangements may be employed within the scope of the invention.

In the embodiment illustrated in FIG. 2, the sub ADC ADC-j has a differential input with a positive input terminal 100a for receiving an input voltage $V_{inp}$ and a negative input terminal 100b for receiving an input voltage $V_{inn}$. According to other embodiments, the sub ADC ADC-j may have a single-ended input. This may e.g. be accomplished by connecting the negative input terminal 100b to a fixed voltage, e.g. to a voltage close to the middle of an input range of the sub ADC ADC-j.

During a first phase of each conversion cycle, the input voltages $V_{inp}$ and $V_{inn}$ may be supplied to the capacitors 85a and 85b by closing switch devices 105a and 105b. At the same time, switch devices 110a and 110b are kept open for disconnecting the reference-voltage selection unit 45 from the comparator arrangement. According to some embodiments, the switch devices 110a and 110b may be replaced with short circuits. Instead, the control unit 60 may be arranged to generate control signals to the switch devices in the reference-voltage selection unit 45 such that the output terminals 55a and 55b are in a high-impedance state during the first phase of the conversion cycle. For example, with reference to the embodiment illustrated in FIG. 3, the control unit may be arranged to ensure that the switch devices 130a-b, 135a-b, 140a-b, and 145a-b are all open during the first phase of the conversion cycle.

Furthermore, in the first phase of the conversion cycle, the switch devices 90a and 90b are closed in order to provide an auto-zeroing of the comparator 80. Thereby, the influence of offset errors in the comparator 80 may be reduced.

At the end of the first phase of the conversion cycle, the switch devices 100a-b and 90a-b are opened. Thereby, the differential input voltage of the sub ADC ADC-j is held, or stored, by the capacitors 85a and 85b and represented by a charge difference between the charges stored on these capacitors 85a and 85b.

During a second phase of the conversion cycle, the switch devices 110a-b are closed, and one comparison is performed for each bit of the SAR (70) in order to determine the digital output word of the sub ADC ADC-j. In the first comparison, the most significant bit (MSB) of the SAR 70 is set to '1' and the remaining bits are set to '0'. If the differential input voltage $V_{inp}$-$V_{inn}$ is higher than the differential reference voltage $V_{refp}$-$V_{refn}$ output from the reference-voltage selection unit 45, the decision unit 95 outputs a logic '1', which is stored in the MSB position of the SAR 70. Otherwise, the decision unit 95 outputs a '0', which is stored in the MSB position of the SAR 70. The result from the first comparison is kept in the MSB position of the SAR 70 for the remaining comparisons of the conversion cycle.

In the second comparison, the bit with second highest significance (MSB-1) is to be determined. The MSB-1 of the SAR 70 is set to a '1' and the bits with lesser significance are set to '0'. If the differential input voltage $V_{inp}$-$V_{inn}$ is higher than the differential reference voltage $V_{refp}$ $V_{refn}$ output from the reference-voltage selection unit 45, the decision unit 95 outputs a logic '1', which is stored in the MSB-1 position of the SAR 70. Otherwise, the decision unit 95 outputs a '0', which is stored in the MSB-1 position of the SAR 70. The result from the second comparison is kept in the MSB-1 position of the SAR 70 for the remaining comparisons of the conversion cycle.

This process is repeated for each bit of the SAR 70. At the end of the conversion cycle, the digital output word of the sub ADC ADC-j is stored in the SAR 70 and made available on a digital output port 115 of the sub ADC ADC-j.

The circuit diagram shown in FIG. 2 is simplified. For example, additional control circuitry (not shown) may be comprised in the sub ADC ADC-j, e.g. for controlling the switch devices 90a-b, 105a-b, 110a-b, the SAR 70, the decision unit 95, and/or the control unit 60.

In many applications, there is typically a correlation between consecutive analog input samples of an ADC. In accordance with the present invention, it has been realized that in a PSA-ADC wherein each sub ADC only makes use of a single one of the reference voltages from the common reference-voltage generation unit at a time, such correlation between consecutive input samples may result in noise and nonlinearity errors. For example, if a number of consecutive input samples during a certain time interval have been in the lower end of the input range of the PSA-ADC, a majority of the sub ADCs in the PSA ADC may be switched in to the "lower half" of the reference-voltage generation unit (i.e. switched in to output terminals of the reference-voltage generation unit on which reference voltages in the lowest half of the reference voltages are output) as a consequence of that these sub ADCs perform their binary searches among reference voltages in this lower half. During another time interval, a number of consecutive input samples may instead have been in the upper end of the input range of the PSA ADC. Then, a majority of the sub ADCs may instead be switched in to the "upper half" of the reference-voltage generation unit (i.e. switched in to output terminals of the reference-voltage generation unit on which reference voltages in the highest half of the reference voltages are output). Hence, the reference-voltage generation unit may, under such circumstances, be relatively heavily asymmetrically loaded. Furthermore, this asymmetrical load may vary in time. As a consequence of this time-varying asymmetrical loading, the reference voltages generated by the reference-voltage generation unit may vary slightly in time, or fluctuate, and have difficulties to settle at their proper levels under certain conditions, e.g. when the reference-voltage generation unit makes a transition from being heavily loaded in the lower half to being heavily loaded in the upper half, or vice versa. This, in turn, may result in noise and nonlinearity errors, unless the reference-voltages are given enough time to settle properly. Hence, for a given effective resolution (e.g. given signal-to-noise-and-distortion ratio (SNDR) or effective number of bits (ENOB)), the asymmetrical loading of the reference-voltage generation unit may be a limiting factor for the maximum sampling rate of the PSA ADC.

The reference-voltage selection unit 45 of the embodiment illustrated in FIG. 2, which, for each value of $X_{SA}$, is switched in to both the output terminal of the reference-voltage generation unit 35 that corresponds to $X_{SA}$ and the output terminal of the reference voltage generation unit 35 that corresponds to $X_{max}+X_{min}-X_{SA}$ provides a loading of the reference-voltage generation unit 35 which is symmetric and the total loading of the reference-voltage generation unit from all the sub ADCs ADC-1, . . . , ADC-M is also symmetrical. Thereby, reference-voltage fluctuations and nonlinearity errors may be significantly reduced.

A further advantage of the reference-voltage selection unit 45 is that reference voltages are provided to the comparator arrangement of each sub ADC ADC-1, . . . , ADC-M differentially via two paths of a differential signal path. Compared with a PSA-ADC wherein each sub ADC only makes use of a single one of the reference voltages from the common reference-voltage generation unit at a time, the voltage swing of the reference voltage provided to the comparator arrangement is doubled, which is advantageous e.g. in that it facilitates a supply-voltage reduction. Furthermore, noise and distortion that enter the two paths of the differential signal paths in the same way, i.e. as a common-mode error, cancel to a high degree provided that the two paths are well matched.

FIG. 3 shows a simplified circuit diagram of an embodiment of the reference-voltage selection unit 45 and an embodiment of the reference-voltage generation unit 35. In FIG. 3, the reference-voltage generation unit is arranged to generate 16 different reference voltages on 16 output terminals 40-0, . . . , 40-15. Hence, the embodiment illustrated in FIG. 3 is suitable for a 4-bit ADC. However, the use of 16 different reference voltages is only an example used for illustration. Other numbers of reference voltages may be used within the scope of the invention.

As illustrated, the reference-voltage generation unit 35 may comprise a resistor string supplied at one end with a voltage $V_A$ and at one end with a voltage $V_B$. The resistor string in the reference-voltage generation unit 35 in the embodiment illustrated in FIG. 3 is arranged to generate the reference voltages to be output on the output terminals 40-0, ..., 40-15 of the reference-voltage generation unit 35 by means of resistive voltage division.

In the embodiment illustrated in FIG. 3, the reference-voltage selection unit comprises a first and a second switch layer. The first switch layer comprises switch devices 120-0, ..., 120-15. The second switch layer comprises the switch devices 130*a*-*b*, 135*a*-*b*, 140*a*-*b*, and 145*a*-*b*.

The first switch layer comprises a plurality of switch groups, wherein each switch group comprises a plurality of switch devices. For example, in FIG. 3, the switch devices 120-0, ..., 120-3 belong to a first switch group, the switch devices 120-4, ..., 120-7 belong to a second switch group, the switch devices 120-8, ..., 120-11 belong to a third switch group, and the switch devices 120-0, ..., 120-3 belong to a fourth switch group. Each switch device in a switch group is connected to a unique one of the output terminals 40-0, ..., 40-15 of the reference-voltage generation unit 35 with a first terminal of the switch device. For example, the switch device 120-0 is connected to the output terminal 40-0, the switch device 120-1 is connected to the output terminal 40-1, etc. Furthermore, each switch device in a switch group is connected to a common node 125*a*-*d* of the switch group with a second terminal of the switch device.

According to an example embodiment, with reference to FIG. 3, the range [$X_{min}$, $X_{max}$] is [0, 15]. Furthermore, the output terminal 40-0 corresponds to the digital number X=0, the output terminal 40-1 corresponds to the digital number X=1, the output terminal 40-2 corresponds to the digital number X=2, etc. In this example, the digital number X is an integer between 0 and 15. However, as is well known in the art, the same set of bits that are used to represent an integer may instead be used to represent another type of number, such as a decimal number between 0 and 1, or a decimal number between −1 and 1, etc. Hence, the choice of X being an integer is only an example used for illustration.

For each X in the range [$X_{min}$, $X_{max}$], the one of the switch devices 120-0, ..., 120-15 that is connected to the one of the output terminals 40-0, ..., 40-15 of the reference voltage generation unit 35 that corresponds to X and the one of the switch devices 120-0, ..., 120-15 that is connected to the one of the output terminals 40-0, ..., 40-15 of the reference voltage generation unit 35 that corresponds to $X_{max}+X_{min}-X$ belong to different switch groups. For example, the switch devices 120-0 and 120-15 belong to different switch groups, the switch devices 120-1 and 120-14 belong to different switch groups, ..., the switch devices 120-6 and 120-9 belong to different switch groups, and the switch devices 120-7 and 120-8 belong to different switch groups. Thereby, the one of the switch devices 120-0, ..., 120-15 that is connected to the one of the output terminals 40-0, ..., 40-15 that corresponds to X and the one of the switch devices 120-0, ..., 120-15 that is connected to the one of the output terminals 40-0, ..., 40-15 that corresponds to $X_{max}+X_{min}-X$ can be closed simultaneously without the risk of a short circuit between these output terminals of the reference-voltage generation unit 35 via one of the common nodes 125*a*-*d*.

For each switch group in the first switch layer, the second switch layer comprises a switch device 130*a*, 135*a*, 140*a*, 145*a* operatively connected between the common node 125*a*-*d* of the switch group and the positive output terminal 55*a* of the reference-voltage selection unit 45. Furthermore, for each switch group in the first switch layer, the second switch layer comprises a switch device 130*b*, 135*b*, 140*b*, 145*b* operatively connected between the common node 125*a*-*d* of the switch group and the negative output terminal 55*b* of the reference-voltage selection unit 45.

According to an embodiment, the control unit 60 (FIG. 2) of each sub ADC ADC-1, ..., ADC-M is arranged to generate control signals for the switch devices in the first layer of the reference-voltage selection unit 45 of the sub ADC based on the digital number $X_{SA}$ in the SAR 70 of the sub ADC for closing a first and a second selected switch device in the first switch layer. The first selected switch device is the switch device connected to the one of the output terminals 40-0, ..., 40-15 that corresponds to $X_{SA}$. The second selected switch device is the switch device connected to the one of the output terminals 40-0, ..., 40-15 that corresponds to $X_{max}+X_{min}-X_{SA}$. Furthermore, the control unit 60 is arranged to generate control signals for the switch devices in the second layer of the reference-voltage selection unit 45 of the sub ADC based on the digital number $X_{SA}$ in the SAR 70 of the sub ADC for closing the one of the switch devices 130*a*, 135*a*, 140*a*, 145*a* in the second switch layer that is connected to the common node 125*a*-*d* of the switch group to which the first selected switch device 120-0, ..., 120-15 belongs, and for closing the one of the switch devices 130*b*, 135*b*, 140*b*, 145*b* in the second switch layer that is connected to the common node 125*a*-*d* of the switch group to which the first selected switch device 120-0, ..., 120-15 belongs. Thereby, the reference voltage that corresponds to $X_{SA}$ is forwarded to the positive output terminal 55*a* of the reference-voltage selection unit 45 and the reference voltage that corresponds to $X_{max}+X_{min}-X_{SA}$ is forwarded to the negative output terminal 55*b* of the reference-voltage selection unit 45.

According to some embodiments, the number of switch groups in the first switch layer is an integer power of two, e.g. 2, 4, 8, 16, etc. This facilitates design of a control unit 60 with a relatively low complexity, which in turn provides for implementation of the control unit 60 with a relatively small circuit area. However, as long as the condition that, for each X, the ones of the switch devices 120-0, ..., 120-15 in the first switch layer that are connected to the ones of the output terminals 40-0, ..., 40-15 of the reference-voltage generation unit 35 that correspond to X and $X_{max}+X_{min}-X$ belong to different switch groups is fulfilled, any number of switch groups may be used in the first layer. Furthermore, the switch groups may, but does not necessarily have to, comprise the same number of switch devices.

The use of two switch layers, wherein the first switch layer is divided into a plurality of switch groups (e.g. as in the embodiment illustrated in FIG. 3) has a number of advantages. For example, the differential signal paths from the reference-voltage generation unit 35 to the comparator arrangement of a sub ADC ADC-1, ..., ADC-M can be obtained at a relatively low overhead cost in terms of circuit area; each switch device 120-0, ..., 120-15 in the first switch layer can be shared between the signal paths from an output terminal 40-0, ..., 40-*n* of the reference-voltage selection unit 35 and the output terminals 55*a* and 55*b* of the reference-voltage selection unit 45, a dedicated switch device for each output terminal 55*a* and 55*b* is only needed in the second switch layer. Furthermore, by means of carefully selecting the number of switch groups in the first layer, and thereby the amount of parasitic load in the signal paths as outlined below, it is possible to obtain relatively fast settling at the output terminals 55*a* and 55*b* of the reference-voltage selection unit 45. Hence, a relatively high sampling rate of the PSA-ADC is therefore facilitated.

An appropriate number of switch groups in the first switch layer of the reference-voltage selection unit 45 may e.g. be decided based on operating speed considerations due to parasitic load in the signal paths between each of the input terminals 50-0, . . . , 50-*n* and the output terminals 55*a* and 55*b* of the reference-voltage selection unit 45. For example, an increase of the number of switch groups in the first switch layer results in a decrease of the number of switch devices connected to each common node (e.g. nodes 125*a*-*d* in the embodiment of FIG. 3). Hence, the parasitic capacitive load in the signal paths from one input terminal 50-0, . . . , 50-*n* to the output terminals 55*a* and 55*b* of the reference-voltage selection unit 45 due to switch devices in the first switch layer is thereby decreased. However, at the same time, the number of switch devices in the second switch layer is increased, whereby the parasitic capacitive load due to switch devices in the second switch layer is increased. Furthermore, area constraints may also be taken into account when deciding the number of switch groups in the first switch layer, an increase in the number of switch groups results in an increased number of switches in the second switch layer and, thereby, possibly an increased circuit area. An appropriate number of switch groups in the first switch layer may e.g. be determined based on circuit simulation and/or measurements.

In accordance with embodiments of the present invention, investigations have shown that using at least four switch groups in the first switch layer is suitable for obtaining fast settling at the output terminals 55*a* and 55*b* of the reference-voltage selection unit 45 when the number of reference-voltages output from the reference-voltage generation unit 35 is 16 or more.

Figure 4A:
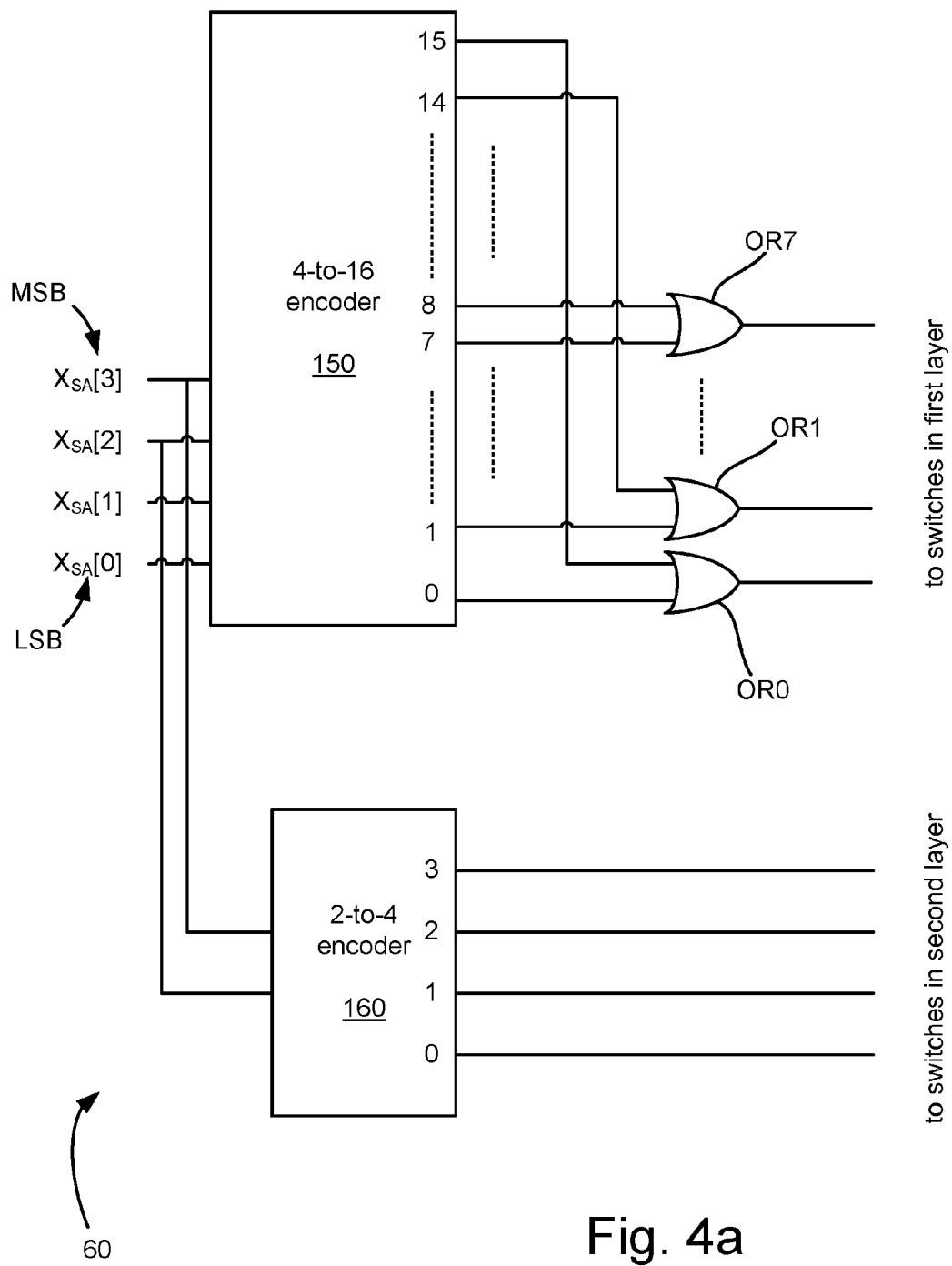
FIG. 4a is a circuit diagram of a control unit according to an embodiment.

FIG. 4*a* is a circuit diagram of an embodiment of the control unit 60, which is suitable for controlling the embodiment of the reference-voltage selection unit 45 illustrated in FIG. 3. It is assumed that a switch device is closed and open when the control signal supplied to it is '1' and '0', respectively. Modifying the embodiment of the control unit 60 illustrated in FIG. 4*a* for a situation where one or more of the switch devices in the reference-voltage selection unit 45 are instead closed and open when the control signal is '0' and '1', respectively, is a straight-forward task for a person skilled in the art.

The embodiment of the control unit 60 illustrated in FIG. 4*a* comprises a 4-to-16 encoder 150. For other numbers of reference voltages than 16, other encoders should be used. For example, a 5-to-32 encoder should be used for 32 reference voltages, a 6-to-64 encoder should be used for 64 reference voltages, a k-to-$2^k$ encoder should be used for $2^k$ reference voltages, etc. A truth-table 170 for the 4-to-16 encoder is shown in FIG. 4*b*. For each of the 16 possible combinations of the 4 bits of $X_{SA}$, a unique one of the 16 outputs of the 4-to-16 encoder 150 is set to '1', whereas the other 15 outputs are set to '0'. Furthermore, the embodiment of the control unit 60 illustrated in FIG. 4*a* comprises eight two-input OR gates OR0, . . . , OR7. The input terminals of OR0 are connected to the 0-output and the 15-output of the 4-to-16 encoder 150. The input terminals of OR1 are connected to the 1-output and the 14-output of the 4-to-16 encoder 150. The input terminals of OR2 (not explicitly shown in FIG. 4*a*) are connected to the 2-output and the 13-output of the 4-to-16 encoder 150. The input terminals of OR3 (not explicitly shown in FIG. 4*a*) are connected to the 3-output and the 12-output of the 4-to-16 encoder 150. The input terminals of OR4 (not explicitly shown in FIG. 4*a*) are connected to the 4-output and the 11-output of the 4-to-16 encoder 150. The input terminals of OR5 (not explicitly shown in FIG. 4*a*) are connected to the 5-output and the 10-output of the 4-to-16 encoder 150. The input terminals of OR6 (not explicitly shown in FIG. 4*a*) are connected to the 6-output and the 9-output of the 4-to-16 encoder 150. The input terminals of OR7 are connected to the 7-output and the 8-output of the 4-to-16 encoder 150.

According to embodiments, the output signal from each of the OR gates OR0, . . . , OR7 is used to control two switch devices in the first switch layer of the reference-voltage selection unit 45 of the embodiment illustrated in FIG. 3. The output signal from OR0 is used to control switch devices 120-0 and 120-15. The output signal from OR1 is used to control switch devices 120-1 and 120-14. The output signal from OR2 is used to control switch devices 120-2 and 120-13. The output signal from OR3 is used to control switch devices 120-3 and 120-12. The output signal from OR4 is used to control switch devices 120-4 and 120-11. The output signal from OR5 is used to control switch devices 120-5 and 120-10. The output signal from OR6 is used to control switch devices 120-6 and 120-9. The output signal from OR7 is used to control switch devices 120-7 and 120-8.

Furthermore, the embodiment of the control unit 60 illustrated in FIG. 4*a* comprises a 2-to-4 encoder 160, whose input terminals are arranged to receive the two MSBs of $X_{SA}$. For other numbers of switch groups in the first switch layer of the reference-voltage selection unit 45, other encoders should be used. For example, for eight switch groups, a 3-to-8 encoder should be used, for 16 switch groups, a 4-to-16 encoder should be used, etc. A truth table 180 for the 2-to-4 encoder 160 is shown in FIG. 4*b*. For each of the four different possible combinations of the two MSBs of $X_{SA}$, a unique one of the four outputs of the 2-to-4 encoder 160 is set to '1', whereas the other three outputs are set to '0'. According to an embodiment, each of the four output signals from the 2-to-4 encoder 160 is used to control two switch devices in the second switch layer of the reference-voltage selection unit 45 of the embodiment illustrated in FIG. 3. The 0-output signal is used to control switch devices 130*a* and 145*b*. The 1-output signal is used to control switch devices 135*a* and 140*b*. The 2-output signal is used to control switch devices 140*a* and 135*b*. The 3-output signal is used to control switch devices 145*a* and 130*b*.

The embodiment of the control unit 60 illustrated in FIGS. 4*a* and *b* is only an example. Other embodiments are possible within the scope of the invention.

The embodiments described so far in this specification utilizes a single reference-voltage generation unit 35. For an N-bit ADC, that reference-voltage generation unit 35 should generate $2^N$ different reference voltages. Hence, the number of reference voltages increases exponentially with N. For a large N, the number of reference voltages may become excessively large. According to some embodiments, this problem may be solved by using several reference-voltage generation units, which may all be common to the sub ADCs ADC-1, . . . , ADC-M. Each of the reference-voltage generation units may be arranged for determination of a subset of the bits in the digital output signal. As a nonlimiting example, an N-bit ADC may utilize a "coarse" reference-voltage generation unit adapted to generate $2^K$ reference voltages (where K<N) for determining the K MSBs of the digital output signal and a "fine" reference-voltage generation unit adapted to generate $2^{N-K}$ reference voltages for determining the remaining N-K LSBs of the digital output signal. Thereby, the number of required reference voltages has been reduced to $2^K+2^{N-K}$, which is less than $2^N$. For example, if N is 10 and K is 5, 64 (=$2^5+2^5$) reference voltages are needed instead of 1024 (=$2^{10}$).

Figure 5:
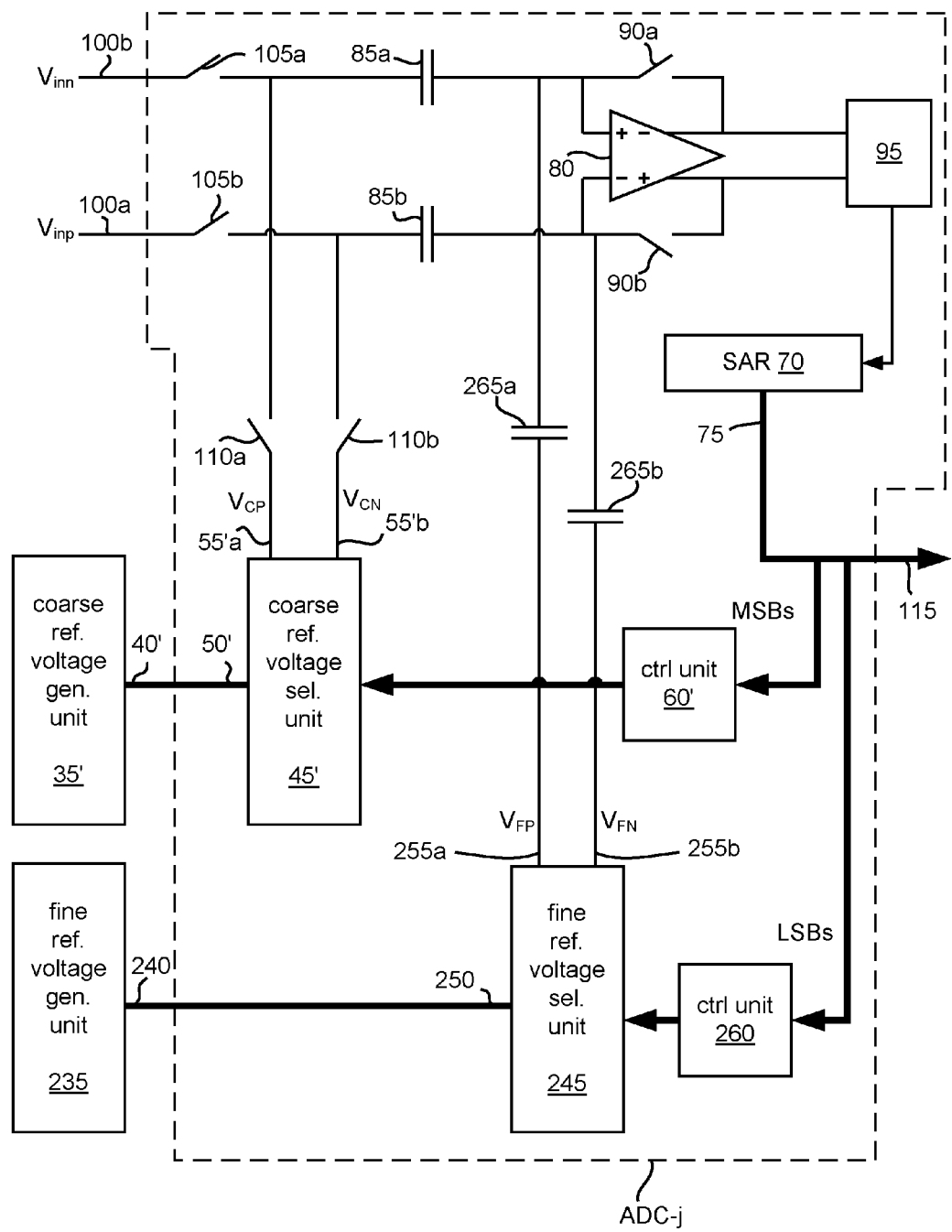
FIG. 5 is a circuit diagram of a sub ADC and a coarse and a fine reference-voltage generation unit according to an embodiment.

FIG. 5 is a simplified circuit diagram of part of the PSA-ADC 10 according to an embodiment. Elements that are the same as or similar to elements of the embodiment illustrated in FIG. 2 are referred to with the same or similar reference signs as in FIG. 2. The number of bits in the output signal of the PSA-ADC 10 is denoted N. According to the embodiment, the PSA-ADC 10 comprises two reference-voltage generation units operatively connected to all of the sub ADCs ADC-1, . . . , ADC-M; a coarse reference-voltage generation unit 35' and a fine reference-voltage generation unit 235, which are shown in FIG. 5. The coarse reference-voltage generation unit 35' has an output port 40', comprising a plurality of output terminals, for outputting a plurality of reference voltages. Similarly, the fine reference-voltage generation unit 235 has an output port 240, comprising a plurality of output terminals, for outputting a plurality of reference voltages. FIG. 5 also shows a simplified circuit diagram of one of the sub ADCs ADC-j according to an embodiment. All sub ADCs ADC-1, . . . , ADC-M may be implemented in the same way as ADC-j.

According to the embodiment, the sub ADC ADC-j comprises a coarse reference-voltage selection unit 45' having an input port 50', a positive output terminal 55'a and a negative output terminal 55'b. Furthermore, the sub ADC ADC-j comprises a control unit 60'. The coarse reference-voltage generation unit 35', the coarse reference-voltage selection unit 45', and the control unit 60' may be arranged and implemented basically in the same way as the reference-voltage generation unit 35, the reference-voltage selection unit 45, and the control unit 60, respectively, in the embodiment illustrated in FIG. 2. However, only the K MSBs (K<N) of the SAR 70 are provided to the control unit 60', instead of all bits, which are provided to the control unit 60 in FIG. 2. Hence, the digital number $X_{SA}$, which is used by the control unit 60' as a basis for controlling the coarse reference-voltage selection unit 45' is represented by the K MSBs stored in the SAR 70. The coarse reference-voltage generation unit 35' is arranged to generate reference voltages for determining the K MSBs of the digital output signal. Therefore, the coarse reference-voltage generation unit 35' is arranged to generate $2^K$ reference voltages. Consequently, the output port 40' of the coarse reference-voltage generation unit 35' comprises $2^K$ output terminals and the input port 50' of the coarse reference-voltage selection unit 45' comprises $2^K$ input terminals. In FIG. 5, the reference voltage output on the positive output terminal 55'a of the coarse reference-voltage selection unit 45' is labeled $V_{CP}$ and the reference voltage output on the negative output terminal 55'b of the coarse reference-voltage selection unit 45' is labeled $V_{CN}$, where the subscript "C" stands for "coarse".

In addition, the sub ADC ADC-j, according to the embodiment illustrated in FIG. 5, comprises a fine reference-voltage selection unit 245. The fine reference-voltage selection unit has an input port 250 operatively connected to the output port 240 of the fine reference-voltage generation unit 235. Furthermore, the fine reference-voltage selection unit 245 has a positive output terminal 255a for outputting a reference voltage $V_{FP}$ and a negative output terminal 255b for outputting a reference voltage $V_{FN}$, where the subscript "F" stands for "fine".

The fine reference-voltage generation unit 235 is arranged to generate a unique reference voltage on each of its output terminals. Each one of said reference voltages, and the corresponding one of the output terminals, correspond to a unique digital number X in a range $[X_{min,LSB}, X_{max,LSB}]$. For example, according to some embodiments, the fine reference-voltage generation unit 235 may be designed to, for each X in $[X_{min,LSB}, X_{max,LSB}]$, output the corresponding reference voltage as a monotone function V(X) of the digital number X. The monotone function V(X) may e.g. be equal or approximately equal to a straight line cX+m, where c and m are constants.

Furthermore, according to the embodiment illustrated in FIG. 5, the sub ADC ADC-j comprises a control unit 260 for controlling the fine reference-voltage selection unit 245 based on a digital number $X_{SA,LSB}$ which is represented by the N-K LSBs stored in the SAR 70.

The fine reference-voltage generation unit 235 is arranged to generate a unique reference voltage on each of its output terminals. Each one of said reference voltages, and the corresponding one of the output terminals, correspond to a unique digital number X in a range $[X_{min,LSB}, X_{max,LSB}]$. For example, according to some embodiments, the fine reference-voltage generation unit 235 may be designed to, for each X in $[X_{min,LSB}, X_{max,LSB}]$, output the corresponding reference voltage as a monotone function V(X) of the digital number X. The monotone function V(X) may e.g. be equal or approximately equal to a straight line cX+m, where c and m are constants.

According to embodiments, the fine reference-voltage generation unit 235 is common to all the sub ADCs ADC-1, . . . , ADC-M, whereby a relatively good mutual matching between the sub ADCs ADC-1, . . . , ADC-M is facilitated.

According to embodiments, the fine reference-voltage selection unit 245 comprises switch devices for selecting and forwarding one of the reference voltages generated by the fine reference voltage generation unit 235 to the positive output terminal 255a as the reference voltage $V_{FP}$ and another one of the reference voltages generated by the reference voltage generation unit 235 to the negative output terminal 255b as the reference voltage $V_{FN}$.

The fine reference-voltage generation unit 235 is arranged to generate reference voltages for determining the N-K LSBs of the digital output signal. Therefore, the fine reference-voltage generation unit 235 is arranged to generate $2^{N-K}$ reference voltages. Consequently, the output port 240 of the fine reference-voltage generation unit 235 comprises $2^{N-K}$ output terminals and the input port 250 of the fine reference-voltage selection unit 245 comprises $2^{N-K}$ (input terminals.

The control unit 260 is, according to embodiments, arranged to generate control signals to the switch devices in the fine reference-voltage selection unit 245 such that the reference voltage from the fine reference-voltage generation unit 35 that corresponds to $X_{SA,LSB}$ is forwarded to the positive output terminal 255a of the fine reference-voltage selection unit 245 as the reference voltage $V_{FP}$. Furthermore, the control unit 260 is arranged to generate control signals to the switch devices in the fine reference-voltage selection unit 245 such that the reference voltage from the fine reference-voltage generation unit 235 that corresponds to $X_{max,LSB}+X_{min,LSB}-X_{SA,LSB}$ is forwarded to the negative output terminal 255b of the fine reference-voltage selection unit 245 as the reference voltage $V_{FN}$.

The fine reference-voltage selection unit 245 may, according to embodiments, be implemented in the same way as the embodiment of the reference-voltage selection unit 45 illustrated in FIG. 3. Hence, according to embodiments, the fine reference-voltage selection unit 245 comprises a first switch layer comprising a plurality of switch groups. Each switch group comprises a plurality of switch devices. Each switch device in a switch group is connected to a unique one of the output terminals of the fine reference-voltage generation unit 235 with a first terminal of the switch device. Furthermore, each switch device in said switch group is connected to a common node of the switch group with a second terminal of the switch device. Moreover, for each X in the range $[X_{min,LSB}, X_{max,LSB}]$, the switch devices connected to the output terminals of the fine reference-voltage generation unit 245 that correspond to X and $X_{max,LSB}+X_{min,LSB}-X$ belong to different switch groups.

Moreover, according to embodiments, the fine reference-voltage selection unit 245 comprises a second switch layer. For each switch group in the first switch layer, the second switch layer comprises a switch device operatively connected between the common node of the switch group and the positive output terminal 255a of the fine reference-voltage selection unit 245. Similarly, for each switch group in the first switch layer, the second switch layer comprises a switch device operatively connected between the common node of the switch group and the second output terminal 255b of the fine reference-voltage selection unit 245.

The control unit 260 may, according to embodiments, be implemented in the same way as the control unit 60 in the embodiment illustrated in FIG. 2. Hence, the control unit 260 may be arranged to generate control signals for the switch devices in the fine reference-voltage selection unit 245 based on the digital number $X_{SA,LSB}$, which is represented by the N-K LSBs of the SAR 70, for closing a first and a second selected switch device in the first switch layer of the fine reference-voltage selection unit 245. The first selected switch device is the switch device that is connected to the output terminal of the fine reference-voltage generation unit 235 that corresponds to $X_{SA,LSB}$. The second selected switch device is the switch device that is connected to the output terminal of the fine reference-voltage generation unit 235 that corresponds to $X_{max,LSB}+X_{min,LSB}-X_{SA,LSB}$. Furthermore, the control unit 260 may be arranged to generate control signals for the switch devices in the fine reference-voltage selection unit 245 based on the digital number $X_{SA,LSB}$ for closing the switch device in the second switch layer that is connected between the common node of the switch group to which the first selected switch device belongs and the positive output terminal 255a of the fine reference-voltage selection unit 245, and for closing the switch device in the second switch layer that is connected between the common node of the switch group to which the second selected switch device belongs and the negative output terminal 255b of the fine reference-voltage selection unit 245.

The control unit 260 may e.g. be implemented in accordance with the embodiment of the control unit 60 illustrated in FIGS. 4a and b.

Similarly to embodiments of the reference-voltage selection unit 245 (FIG. 3), the number of switch devices in the first layer of each fine reference-voltage selection unit 245 may, in some embodiments, be an integer power of two.

Furthermore, according to some embodiments, the number of switch groups in the first layer of each fine reference-voltage selection unit 245 may be at least four. Similarly to what was discussed in the context of the reference-voltage selection unit 45, this may be suitable for obtaining fast settling at the output terminals 255a and 255b of the fine reference-voltage selection unit 245 when the number of reference-voltages output from the fine reference-voltage generation unit 235 is 16 or more.

The fine reference-voltage generation unit 235 may e.g. comprise a resistor string for generation of the reference voltages. The resistor string may e.g. be arranged in the same way as the resistor string of the reference-voltage generation unit 35 illustrated in FIG. 3. However, other types of circuitry for generating the reference voltages may also be used.

In the embodiment of the sub ADC ADC-j illustrated in FIG. 5, the comparator arrangement of the sub ADC ADC-j comprises a capacitor 265a connected between the positive input terminal of the comparator 80 and the positive output terminal 255a of the fine reference-voltage selection unit 245. Similarly, said comparator arrangement comprises a capacitor 265b connected between the negative input terminal of the comparator 80 and the negative output terminal 255b of the fine reference-voltage selection unit 245.

The embodiment of the sub ADC ADC-j illustrated in FIG. 5 may be operated in a similar way as the embodiment illustrated in FIG. 2. During a first phase of a conversion cycle, the switch devices 105a and b may be closed for supplying the input voltages $V_{inp}$ and $V_{inn}$ to the capacitors 85b and 85a, respectively. The switch devices 90a and 90b may be closed for providing an auto-zeroing of the comparator 80. Furthermore, the switch devices 110a and 110b may be set in an open state. The N-K LSBs of the SAR 70 may all be set to '0' for providing the corresponding reference voltages to the capacitors 260a and b during the first phase of the conversion cycle.

During a second phase of the conversion cycle, comparisons may be performed to determine the bits of the digital output word for the particular conversion cycle. During the first K comparisons, the control unit 60', the coarse reference-voltage generation unit 35', and the coarse reference-voltage selection unit 45' are operable for determining the K MSBs in descending order of bit significance. During the subsequent N-K comparisons, the control unit 260, the fine reference-voltage generation unit 235, and the fine reference-voltage selection unit 245 are operable for determining the N-K LSBs in descending order of bit significance. Similarly to the embodiment illustrated in FIG. 2, the value of each bit may be determined by first setting the bit to '1' (in the SAR 70) and the bits with lesser significance to '0'. If the decision unit 95 outputs a '1', the determined bit value is '1', otherwise the determined bit value is '0'. The bit is set to the determined bit value during the determination of bits with lesser significance.

The capacitance values for the capacitances 85a-b and 260a-b should be selected to give the K MSBs and the N-K LSBs the appropriate mutual weights. For example, in an embodiment, each difference between two adjacent reference voltages in the fine reference-voltage generation unit is equal to $\Delta V_F$ and each difference between two adjacent reference voltages in the coarse reference-voltage generation unit is equal to $\Delta V_E$. Furthermore, the capacitance of capacitor 85a is denoted $C_{85a}$, the capacitance of capacitor 85b is denoted $C_{85b}$, the capacitance of capacitor 265a is denoted $C_{265a}$, and the capacitance of capacitor 265b is denoted $C_{265b}$. In this embodiment, the capacitance values may be selected according to $$C_{85a}\Delta V_C = C_{265a}\Delta V_F 2^{N-K}$$

and $$C_{85b}\Delta V_C = C_{265b}\Delta V_F 2^{N-K}.$$

Note that the capacitances $C_{265a}$ and $C_{265}$ may be equal, but does not necessarily have to be equal. Similarly, the capacitances $C_{85a}$ and $C_{85b}$ may be equal, but does not necessarily have to be equal.

According to one embodiment, a 10-bit PSA-ADC is provided, wherein the coarse reference-voltage generation unit 35' is arranged for determination of the 5 MSBs and the fine reference-voltage generation unit 235 is arranged for determination of the 5 LSBs. Furthermore, in this embodiment, the fine and coarse reference-voltage selection unit 245 and 45' in each sub ADC each has a first switch layer with switch devices divided into four switch groups. The number of sub ADCs in the PSA ADC in this embodiment is 14.

According to another embodiment, an 8-bit PSA-ADC is provided, wherein the coarse reference-voltage generation unit 35' is arranged for determination of the 4 MSBs and the fine reference-voltage generation unit 235 is arranged for determination of the 4 LSBs. Furthermore, in this embodiment, the fine and coarse reference-voltage selection unit 245 and 45' in each sub ADC each has a first switch layer with switch devices divided into four switch groups. The number of sub ADCs in the PSA ADC in this embodiment is 10.

If the number of reference voltages generated by the reference-voltage generation unit 35 (FIG. 2), 35' (FIG. 5), or 235 (FIG. 5) is large, such as but not limited to 64 or more, investigations in accordance with embodiments of the present invention have shown that it can be advantageous to have more than two switch layers in the reference-voltage selection unit 45 (FIG. 2), 45' (FIG. 5), or 245 (FIG. 5). Thereby, the overall parasitic load in the signal path between an input terminal and an output terminal of the reference-voltage selection unit 45, 45', or 245 may be kept relatively low, compared with if only two switch layers were used, whereby a relatively fast operational speed is facilitated.

Figure 6:
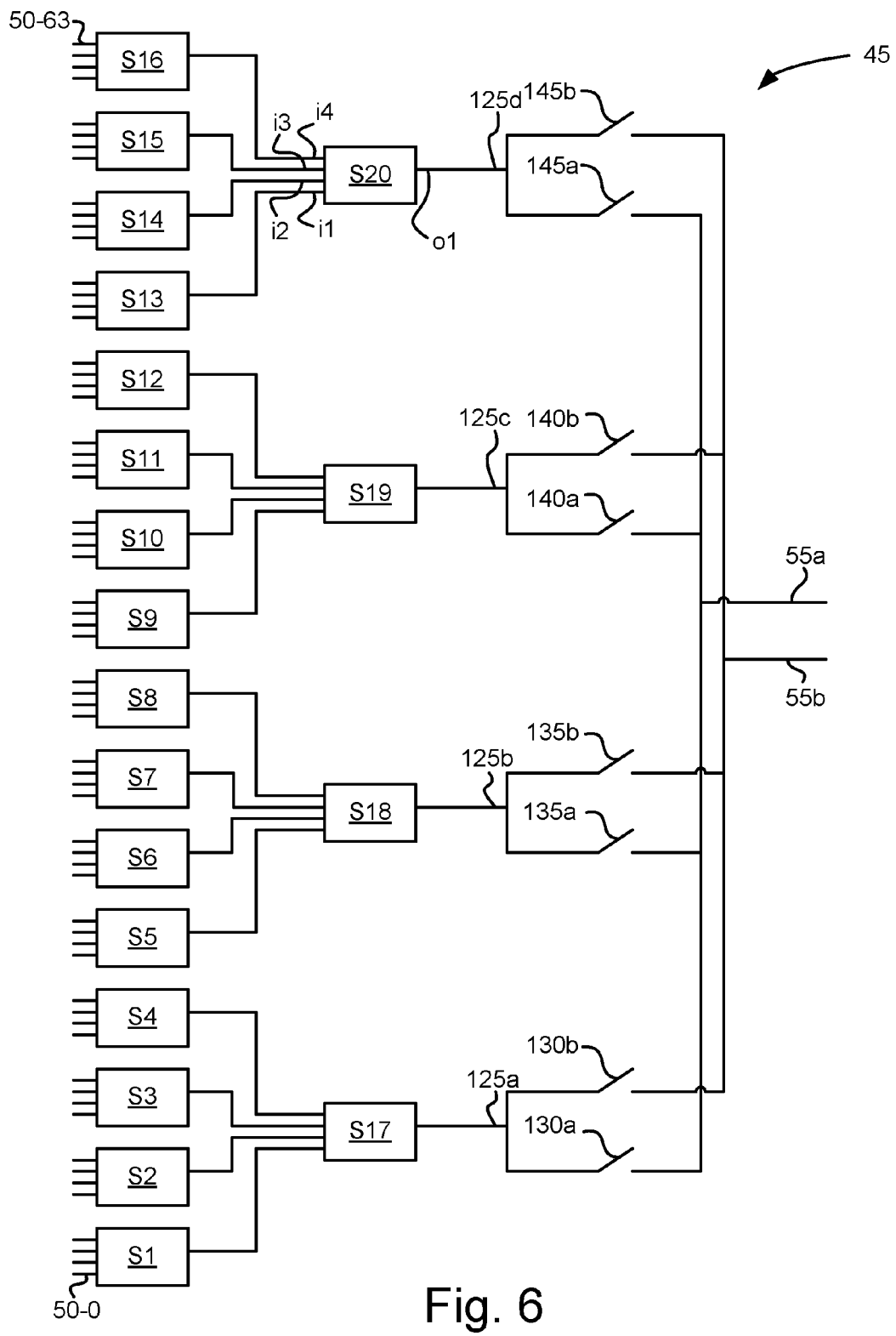
FIG. 6 is a circuit diagram of a reference-voltage selection unit according to an embodiment.

A reference-voltage selection unit with more than two switch layers may e.g. be obtained by operatively connecting one or more intermediate switch layers of switch devices between the first switch layer and the second switch layer of the embodiment illustrated in FIG. 3 for selectably connecting switch devices in the first switch layer to the corresponding common node 125*a-d*. This is illustrated in FIG. 6 with an embodiment of the reference-voltage selection unit 45. Although reference is made to the reference-voltage selection unit 45, the same considerations are applicable to embodiments of the coarse reference-voltage selection unit 45' (FIG. 5) and the fine reference-voltage selection unit 245 (FIG. 5). Elements, nodes, and terminals which are the same or similar as in the embodiment of the reference-voltage selection unit illustrated in FIG. 3 are denoted with the same reference signs in FIG. 6 as in FIG. 3.

In the embodiment illustrated in FIG. 6, the reference-voltage selection unit has 64 input terminals 50-0, 50-1, . . . , 50-63. For readability, only the terminals 50-0 and 50-63 are provided with reference signs in FIG. 6. The circuit diagram of FIG. 6 shows a number of sub groups S1-S20 of switch devices, which are further described below with reference to FIG. 7. The first switch layer in the embodiment illustrated in FIG. 6 comprises the sub groups S1-S16. As in the embodiment illustrated in FIG. 3, the second switch layer comprises the switch devices 130*a-b*, 135*a-b*, 140*a-b*, and 145*a-b*. Furthermore, in the embodiment illustrated in FIG. 6, the reference-voltage selection unit 45 comprises an intermediate switch layer comprising the sub groups S17-S20. The first switch layer comprises four switch groups, each comprising four sub groups of switch devices. For example, a first switch group in the first switch layer comprises the sub groups S1-S4. The switch devices in the first switch group are operatively connected to the common node 125*a* via the sub group S17 in the intermediate switch layer. Furthermore, a second switch group in the first switch layer comprises the sub groups S5-S8. The switch devices in the second switch group are operatively connected to the common node 125*b* via the sub group S18 in the intermediate switch layer. Moreover, a third switch group in the first switch layer comprises the sub groups S9-S12. The switch devices in the third switch group are operatively connected to the common node 125*c* via the sub group S19 in the intermediate switch layer. In addition, a fourth switch group in the first switch layer comprises the sub groups S13-S16. The switch devices in the fourth switch group are operatively connected to the common node 125*d* via the sub group S20 in the intermediate switch layer.

Figure 7:
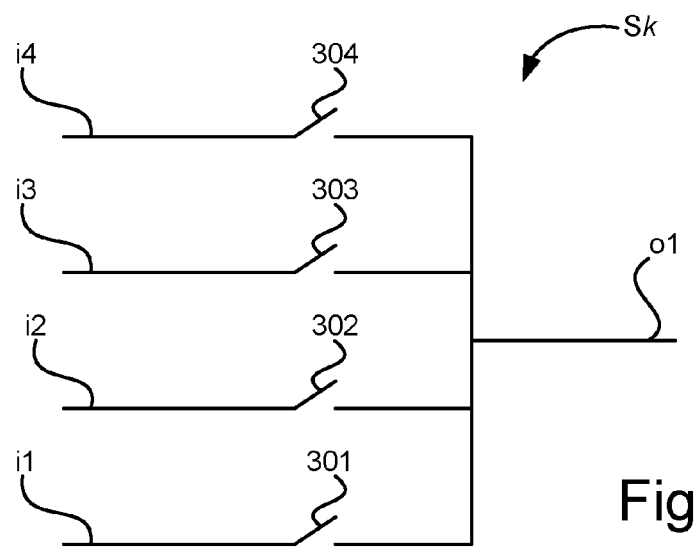
FIG. 7 is a circuit diagram of a sub group of switch devices according to an embodiment.

FIG. 7 is a circuit diagram of a sub group Sk of switches according to an embodiment. Any of the sub groups S1-S20 in FIG. 6 may be implemented in the same way as the sub group Sk in FIG. 7. According to the embodiment illustrated in FIG. 7, the sub group Sk comprises four switch devices 301-304. The switch device 301 is connected to an input terminal i1 of the subgroup Sk with an input terminal of the switch device 301 and to an output terminal o1 of the sub group Sk with an output terminal of the switch device 301. The switch device 302 is connected to an input terminal i2 of the subgroup Sk with an input terminal of the switch device 302 and to the output terminal o1 of the sub group Sk with an output terminal of the switch device 302. The switch device 303 is connected to an input terminal i3 of the subgroup Sk with an input terminal of the switch device 303 and to the output terminal o1 of the sub group Sk with an output terminal of the switch device 303. The switch device 304 is connected to an input terminal i4 of the subgroup Sk with an input terminal of the switch device 304 and to the output terminal o1 of the sub group Sk with an output terminal of the switch device 304. The corresponding input and output terminals of the sub groups S1-S20 shown in FIG. 6 are illustrated with the reference signs i1-i4 and o1 for the sub group S20 in FIG. 6.

The switch devices in the first switch layer and the second switch layer of the embodiment illustrated in FIG. 6 can be controlled in the same way as for the embodiment illustrated in FIG. 3. Therefore, the control of these switch devices is not further described in the context of FIG. 6. A switch device in an intermediate switch layer should be closed whenever a switch device in a preceding switch layer, which is connected to the input terminal of said switch device in the intermediate switch layer, is closed, and open otherwise. Hence, provided that a value '1' is used for controlling a switch device to be closed and a value '0' is used for controlling a switch device to be open, a control signal for controlling a switch device in an intermediate layer can be generated by means of an OR operation on the control signals for the switch devices connected to the input terminal of said switch device in the intermediate layer.

In the embodiment illustrated in FIG. 6, each switch group in the first switch layer comprises 16 switch devices; four switch devices in each sub group. If the reference-voltage selection unit 45 had only comprised the first and the second switch layer, and not the intermediate switch layer (e.g. as in the embodiment illustrated in FIG. 3), all 16 switch devices would have been directly connected to the common node 125*a*, *b*, *c*, or *d*, and thereby provided a relatively large parasitic load. With the intermediate switch layer included, the overall parasitic load in the signal path between an input terminal 50-0, . . . , 50-63 is reduced, whereby a faster settling is facilitated.

Investigations in accordance with embodiments of the present invention have indicated that connecting three switch devices in a preceding switch layer (i.e. neighboring switch layer closer to the input terminals of the reference-voltage selection unit) to the input terminal of a switch device in an intermediate switch layer provides a close to optimal settling speed. However, in cases where the number of input terminals of the reference-voltage selection unit 45 is an integer power of two (e.g. 64 as in FIG. 6), a reduced design complexity is obtained if the number of switch devices connected to the input terminal of said switch device in the intermediate switch layer is also an integer power of two. Therefore, connecting two or four (which are the integer powers of two that are closest to three) switch devices in the preceding switch layer to the input terminal of the switch device in the intermediate switch layer also provides a relatively fast settling. Of these two alternatives, investigations in accordance with embodiments of the present invention have indicated that four switch devices connected to the input terminal of the switch device in the intermediate switch layer provides the fastest settling.

Hence, according to some embodiments of the present invention, each switch device in an intermediate switch layer is connected with an input terminal of the switch device to between two and four switch devices in a preceding switch layer. According to some of these embodiments, each switch device in said intermediate switch layer is connected with an input terminal of the switch device to exactly four switch devices in said preceding switch layer.

Furthermore, according to some embodiments, wherein more than one intermediate switch layer is used, each switch device in each intermediate switch layer is connected with an input terminal of the switch device to between two and four switch devices in a preceding switch layer. According to some of these embodiments, each switch device in each intermediate switch layer is connected with an input terminal of the switch device to exactly four switch devices in said preceding switch layer.

An appropriate number of intermediate switch layers and number of switch devices in each sub group may also be decided based on circuit-area requirements, or a trade-off between circuit-area and settling speed.

According to some embodiments, a PSA-ADC 10 according to embodiments described above may be comprised in an integrated circuit.

Furthermore, according to some embodiments, a PSA-ADC 10 according to embodiments described above may be comprised in an electronic apparatus. The electronic apparatus may e.g. be, but is not limited to, a television set, a liquid-crystal display, a computer monitor, a digital camera, a projector, or a radio receiver.

The present invention has been described above with reference to specific embodiments. However, other embodiments than the above described are possible within the scope of the invention. The different features and steps of the embodiments may be combined in other combinations than those described. The scope of the invention is only limited by the appended patent claims.

The invention claimed is:

1. A parallel successive-approximation analog-to-digital converter for generating a digital output signal based on an analog input signal, comprising:
   a reference-voltage generation unit having a plurality of output terminals, wherein the reference-voltage generation unit is arranged to generate a unique reference-voltage on each of its output terminals, and each reference voltage and corresponding output terminal correspond to a unique digital number in a range $[X_{min}, X_{max}]$;
   a plurality of sub analog-to-digital converters arranged for successive-approximation operation in a time-interleaved manner;
   a reference-voltage selection unit operatively connected to the reference-voltage generation unit for selecting a reference voltage generated by the reference-voltage generation unit based on a digital number $X_{SA}$ stored in a successive-approximation register of the parallel successive-approximation analog-to-digital converter and forwarding the selected reference voltage to a comparator arrangement of a respective sub analog-to-digital converter;
   wherein the reference-voltage selection unit has a first and a second output terminal operatively connected to the comparator arrangement of the respective sub analog-to-digital converter and includes a first switch layer comprising a plurality of switch groups, wherein each switch group comprises a plurality of switch devices, each switch device in a switch group being operatively connected to a unique one of the output terminals of the reference-voltage generation unit by a first terminal of the switch device and to a common node of the switch group by a second terminal of the switch device, and, for each X in the range $[X_{min}, X_{max}]$, the switch devices connected to the output terminals of the reference voltage generation unit that correspond to X and $X_{max}+X_{min}-X$ belong to different switch groups; and
   a second switch layer comprising, for each switch group in the first switch layer, a switch device operatively connected between the common node of the switch group and the first output terminal of the reference-voltage selection unit and a switch device operatively connected between the common node of the switch group and the second output terminal of the reference-voltage selection unit; and
   wherein the parallel successive-approximation analog-to-digital converter comprises a control unit arranged to generate control signals for the switch devices in the reference-voltage selection unit based on the digital number $X_{SA}$ in the successive-approximation register for closing
   a first selected switch device in the first switch layer that is connected to the output terminal of the reference-voltage generation unit that corresponds to $X_{SA}$;
   the switch device in the second switch layer that is connected between the common node of the switch group to which the first selected switch device belongs and the first output terminal;
   a second selected switch device in the first switch layer that is connected to the output terminal of the reference-voltage generation unit that corresponds to Xmax+Xmin−$X_{SA}$; and
   the switch device in the second switch layer that is connected between the common node of the switch group to which the second selected switch device belongs and the second output terminal; and
   wherein the control unit includes
   a first encoder to receive the digital number Xsa and output a first control signal to close both the first selected switch device in the first switch layer that is connected to the output terminal of the reference-voltage generation unit that corresponds to Xsa and the second selected switch device in the first switch layer in the first switch layer that is connected to the output terminal of the reference-voltage generation unit that corresponds to Xmax+Xmin−Xsa; and
   a second encoder to receive most significant bits of the digital number Xsa and output a second control signal to close both the switch device in the second switch layer that is connected between the common node of the switch group to which the first selected switch device belongs and the first output terminal and the switch device in the second switch layer that is connected between the common node of the switch group to which the second selected switch device belongs and the second output terminal.

2. The parallel successive-approximation analog-to-digital converter according to claim 1, wherein the number of switch groups in the first switch layer of each reference-voltage selection unit is an integer power of two.

3. The parallel successive-approximation analog-to-digital converter according to claim 2, wherein the number of switch groups in the first switch layer of each reference-voltage selection unit is at least four.

4. The parallel successive-approximation analog-to-digital converter according to claim 3, wherein the reference-voltage selection unit comprises one or more intermediate switch layers of switch devices operatively connected between the first switch layer and the second switch layer for selectably connecting switch devices in the first switch layer to the corresponding common node.

5. The parallel successive-approximation analog-to-digital converter according to claim 4, wherein each switch device in an intermediate switch layer of the one or more intermediate switch layers is connected by an input terminal of the switch device to between two and four switch devices in a preceding switch layer.

6. The parallel successive-approximation analog-to-digital converter according to claim 5, wherein each switch device in said intermediate switch layer is connected by an input terminal of the switch device to four switch devices in said preceding switch layer.

7. The parallel successive-approximation analog-to-digital converter according to claim 5, wherein each switch device in each intermediate switch layer is connected by an input terminal of the switch device to between two and four switch devices in a preceding switch layer.

8. The parallel successive-approximation analog-to-digital converter according to claim 7, wherein each switch device in each intermediate switch layer is connected by an input terminal of the switch device to four switch devices in said preceding switch layer.

9. The parallel successive-approximation analog-to-digital converter according to claim 8, wherein the reference-voltage generation unit comprises a resistor string.

10. A parallel successive-approximation analog-to-digital converter for generating a digital output signal based on an analog input signal, comprising:
a reference-voltage generation unit having a plurality of output terminals, wherein the reference-voltage generation unit is arranged to generate a unique reference-voltage on each of its output terminals, and each reference voltage and corresponding output terminal correspond to a unique digital number in a range $[X_{min}, X_{max}]$;
a plurality of sub analog-to-digital converters arranged for successive-approximation operation in a time-interleaved manner;
a reference-voltage selection unit operatively connected to the reference-voltage generation unit for selecting a reference voltage generated by the reference-voltage generation unit based on a digital number $X_{SA}$ stored in a successive-approximation register of the parallel successive-approximation analog-to-digital converter and forwarding the selected reference voltage to a comparator arrangement of a respective sub analog-to-digital converter;
wherein the reference-voltage selection unit has a first and a second output terminal operatively connected to the comparator arrangement of the respective sub analog-to-digital converter and includes a first switch layer comprising a plurality of switch groups, wherein each switch group comprises a plurality of switch devices, each switch device in a switch group being operatively connected to a unique one of the output terminals of the reference-voltage generation unit by a first terminal of the switch device and to a common node of the switch group by a second terminal of the switch device, and, for each X in the range $[X_{min}, X_{max}]$, the switch devices connected to the output terminals of the reference voltage generation unit that correspond to X and $X_{max}+X_{min}-X$ belong to different switch groups; and
a second switch layer comprising, for each switch group in the first switch layer, a switch device operatively connected between the common node of the switch group and the first output terminal of the reference-voltage selection unit and a switch device operatively connected between the common node of the switch group and the second output terminal of the reference-voltage selection unit; and
wherein parallel successive-approximation analog-to-digital converter comprises a control unit arranged to generate control signals for the switch devices in the reference-voltage selection unit based on the digital number $X_{SA}$ in the successive-approximation register for closing
a first selected switch device in the first switch layer that is connected to the output terminal of the reference-voltage generation unit that corresponds to $X_{SA}$;
the switch device in the second switch layer that is connected between the common node of the switch group to which the first selected switch device belongs and the first output terminal;
a second selected switch device in the first switch layer that is connected to the output terminal of the reference-voltage generation unit that corresponds to Xmax+Xmin−$X_{SA}$; and
the switch device in the second switch layer that is connected between the common node of the switch group to which the second selected switch device belongs and the second output terminal;
wherein the successive-approximation register comprises N bits, the reference-voltage generation unit is a coarse reference-voltage generation unit arranged to generate reference voltages for determining K most significant bits of the digital output signal, the reference voltage selection unit is a coarse reference voltage selection unit arranged to select and forward reference voltages for determining the K most significant bits of the digital output signal, the digital number $X_{SA}$ is determined by the K most significant bits of the successive-approximation register, and the parallel successive-approximation analog-to-digital converter further comprises a fine reference-voltage generation unit for determining the N-K least significant bits of the digital output signal and a fine reference-voltage selection unit for determining the N-K least significant bits of the digital output signal; and, wherein the fine reference-voltage generation unit has a plurality of output terminals, wherein the fine reference-voltage generation unit is arranged to generate a unique reference voltage on each of its output terminals, and each reference voltage and corresponding output terminal correspond to a unique digital number in the range [Xmin,LSB, Xmax,LSB] and wherein
the fine reference-voltage selection unit has a first and a second output terminal operatively connected to the comparator arrangement of the respective sub analog-to-digital converter and comprises:
a third switch layer comprising a plurality of switch groups, wherein each switch group comprises a plurality of switch devices, each switch device in a switch group is operatively connected to a unique one of the output terminals of the fine reference-voltage generation unit by a first terminal of the switch device and to a common node of the switch group by a second terminal of the switch device, and, for each X in the range [Xmin,LSB, Xmax,LSB], the switch devices connected to the output terminals of the fine reference-voltage unit that correspond to X and Xmin,LSB, Xmax,LSB-X belong to different switch groups;

a fourth switch layer comprising, for each switch group in the third switch layer, a switch device operatively connected between the common node of the switch group and the first output terminal of the fine reference-voltage selection unit and a switch device operatively connected between the common node of the switch group and the second output terminal of the fine reference-voltage selection unit; and the parallel successive approximation analog-to-digital converter comprises a further control unit arranged to generate control signals for the switch devices in the fine reference-voltage selection unit of the respective sub analog-to-digital converter based on a digital number XSA,LSB determined by the N-K least significant bits of the successive-approximation register for closing a third selected switch device in the third switch layer that is connected to the output terminal of the fine reference-voltage generation unit that corresponds to XSA,LSB;

the switch device in the fourth switch layer that is connected between the common node of the switch group to which the third selected switch device belongs and the first output terminal of the fine reference-voltage selection unit;

a fourth selected switch device in the third switch layer that is connected to the output terminal of the fine reference-voltage generation unit that corresponds to Xmax,LSB+Xmin,LSB-XSA,LSB;

and the switch device in the fourth switch layer that is connected between the common node of the switch group to which the fourth selected switch device belongs and the second output terminal of the fine reference-voltage selection unit.

11. The parallel successive-approximation analog-to-digital converter according to claim 10, wherein the number of switch groups in the third switch layer of each fine reference-voltage selection unit is an integer power of two.

12. The parallel successive-approximation analog-to-digital converter according to claim 11, wherein the number of switch groups in the third switch layer of each fine reference-voltage selection unit is at least four.

13. The parallel successive-approximation analog-to-digital converter according to claim 12, wherein the fine reference-voltage generation unit comprises a resistor string.

14. The parallel successive-approximation analog-to-digital converter of claim 1, wherein the parallel successive-approximation analog-to-digital converter is included in an integrated circuit.

15. The parallel successive-approximation analog-to-digital converter of claim 1, wherein the parallel successive-approximation analog-to-digital converter is included in an electronic apparatus.

16. The parallel successive-approximation analog-to-digital converter according to claim 15, wherein the electronic apparatus is a television set, a liquid-crystal display, a computer monitor, a digital camera, a projector, or a radio receiver.

17. The parallel successive-approximation analog-to-digital converter of claim 10, where the parallel successive-approximation analog-to-digital converter is included in an integrated circuit.

18. The parallel successive-approximation analog-to-digital converter of claim 10, where the parallel successive-approximation analog-to-digital converter is included in an integrated circuit.

19. The parallel successive-approximation analog-to-digital converter of claim 1, wherein the reference-voltage selection unit comprises one or more intermediate switch layers of switch devices operatively connected between the first switch layer and the second switch layer for selectably connecting switch devices in the first switch layer to the corresponding common node.

* * * * *

UNITED STATES PATENT AND TRADEMARK OFFICE
CERTIFICATE OF CORRECTION

PATENT NO. : 8,456,347 B2
APPLICATION NO. : 13/122824
DATED : June 4, 2013
INVENTOR(S) : Wikner It is certified that error appears in the above-identified patent and that said Letters Patent is hereby corrected as shown below:

On the Title Page, in Item (75), under "Inventor", in Column 1, Line 1, delete "Linkoping" and insert -- Linköping --, therefor.

In the Specification

In Column 2, Line 20, delete "$X_{min}+X_{max}-X$" and insert -- $X_{max}+X_{min}-X$ --, therefor.

In Column 7, Line 41, delete "$V_{refp} V_{refn}$" and insert -- $V_{refp} - V_{refn}$ --, therefor.

In Column 11, Line 54, delete "O-output" and insert -- 0-output --, therefor.

In Column 13, Line 45, delete "$V_{cp}$" and insert -- $V_{CP}$ --, therefor.

In Column 14, Line 7, delete "$X_{SA,LSB}$" and insert -- $X_{SA,LSB}$, --, therefor.

In Column 14, Line 41, delete "$2^{N-K}$ (input" and insert -- $2^{N-K}$ input --, therefor.

In Column 16, Line 44, delete "$\Delta V_E$." and insert -- $\Delta V_C$. --, therefor.

In Column 16, Line 57, delete "$C_{265}$" and insert -- $C_{265b}$ --, therefor.

In Column 18, Line 9, delete "it" and insert -- i1 --, therefor.

In the Claims

In Column 20, Lines 40-41, in Claim 1, delete "Xmax+Xmin-$X_{SA}$;" and insert -- $X_{max}+X_{min}-X_{SA}$; --, therefor.

In Column 20, Line 47, in Claim 1, delete "Xsa" and insert -- $X_{SA}$ --, therefor.

Signed and Sealed this
First Day of October, 2013

Teresa Stanek Rea
*Deputy Director of the United States Patent and Trademark Office*

CERTIFICATE OF CORRECTION (continued)
U.S. Pat. No. 8,456,347 B2

In Column 20, Line 51, in Claim 1, delete "Xsa" and insert -- $X_{SA}$ --, therefor.

In Column 20, Line 52, in Claim 1, delete "in the first switch layer in the first switch layer" and insert -- in the first switch layer --, therefor.

In Column 20, Lines 54-55, in Claim 1, delete "Xmax+Xmin-Xsa;" and insert -- $X_{max}+X_{min}-X_{SA}$; --, therefor.

In Column 20, Line 57, in Claim 1, delete "Xsa" and insert -- $X_{SA}$ --, therefor.

In Column 22, Lines 31-32, in Claim 10, delete "Xmax+Xmin-$X_{SA}$;" and insert -- $X_{max}+X_{min}-X_{SA}$; --, therefor.

In Column 22, Line 59, in Claim 10, delete "[Xmin,LSB,Xmax,LSB]" and insert -- $[X_{min,LSB}, X_{max,LSB}]$ --, therefor.

In Column 23, Lines 4-5, in Claim 10, delete "[Xmin,LSB,Xmax,LSB]," and insert -- $[X_{min,LSB}, X_{max,LSB}]$, --, therefor.

In Column 23, Line 7, in Claim 10, delete "Xmin,LSB, Xmax,LSB-X" and insert -- $X_{min,LSB}, X_{max,LSB}-X$ --, therefor.

In Column 23, Line 22, in Claim 10, delete "XSA,LSB" and insert -- $X_{SA,LSB}$ --, therefor.

In Column 23, Line 26, in Claim 10, delete "XSA,LSB;" and insert -- $X_{SA,LSB}$; --, therefor.

In Column 23, Lines 34-35, in Claim 10, delete "Xmax,LSB+Xmin,LSB-XSA,LSB;" and insert -- $X_{max,LSB}+X_{min,LSB}-X_{SA,LSB}$; --, therefor.